(12) United States Patent
Jung et al.

(10) Patent No.: US 10,762,852 B2
(45) Date of Patent: Sep. 1, 2020

(54) DISPLAY DEVICE

(71) Applicant: SAMSUNG DISPLAY CO., LTD., Yongin-si, Gyeonggi-do (KR)

(72) Inventors: Young Taeg Jung, Yongin-si (KR); Hyun Chol Bang, Yongin-si (KR); Ju Hee Hyeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/387,439

(22) Filed: Apr. 17, 2019

(65) Prior Publication Data
US 2019/0318693 A1 Oct. 17, 2019

(30) Foreign Application Priority Data
Apr. 17, 2018 (KR) .................. 10-2018-0044588

(51) Int. Cl.
*G09G 3/3266* (2016.01)
*G09G 3/3233* (2016.01)
*G09G 3/3291* (2016.01)
*H01L 27/32* (2006.01)

(52) U.S. Cl.
CPC ......... *G09G 3/3266* (2013.01); *G09G 3/3233* (2013.01); *G09G 3/3291* (2013.01); *H01L 27/3276* (2013.01); *G09G 2300/0413* (2013.01); *G09G 2300/0426* (2013.01); *G09G 2300/0439* (2013.01); *G09G 2310/08* (2013.01)

(58) Field of Classification Search
CPC .. G09G 3/3266; G09G 3/3233; G09G 3/3291; G09G 2300/0413; G09G 2300/0426; G09G 2300/0439; G09G 2310/08; H01L 27/3276
See application file for complete search history.

(56) References Cited

U.S. PATENT DOCUMENTS

2007/0274433 A1* 11/2007 Tobita .................. G09G 3/3677
377/64
2018/0144688 A1* 5/2018 Lee ....................... G11C 19/184

FOREIGN PATENT DOCUMENTS

KR    10-2017-0056263 A    5/2017

* cited by examiner

*Primary Examiner* — Robert J Michaud
(74) *Attorney, Agent, or Firm* — Lewis Roca Rothgerber Christie LLP

(57) ABSTRACT

A display device includes: a substrate including first and second display regions and first and second non-display regions; a plurality of first pixels in the first display region; a plurality of second pixels in the second display region; a plurality of first scan stage circuits in the first non-display region, the first scan stage circuits configured to provide a scan signal to the first pixels; a plurality of second scan stage circuits in the second non-display region, the second scan stage circuits configured to provide a scan signal to the second pixels; a plurality of dummy scan stage circuits in the second non-display region, the dummy scan stage circuits being between the second scan stage circuits; and a scan bridge line in the second non-display region, the scan bridge line connecting one second scan stage circuit among the second scan stage circuits and a dummy scan stage circuit adjacent thereto.

20 Claims, 16 Drawing Sheets

DISPLAY DEVICE

CROSS-REFERENCE TO RELATED APPLICATION

This application claims priority to and the benefit of Korean patent application 10-2018-0044588 filed on Apr. 17, 2018 in the Korean Intellectual Property Office, the entire disclosure of which is incorporated herein by reference.

BACKGROUND

1. Field

Aspects of some example embodiments of the present disclosure relate to a display device.

2. Related Art

With the development of information technologies, the importance of a display device, which is a connection medium between a user and information, has increased. Recently, a liquid crystal display device, an organic light emitting display device, and the like have been widely used.

Such a display device may include a plurality of pixels and drivers for driving the pixels.

The drivers may be mounted in the display device. Therefore, a dead space of the display device may occur.

The above information disclosed in this Background section is only for enhancement of understanding of the background of the invention and therefore it may contain information that does not constitute prior art.

SUMMARY

Aspects of some example embodiments may include a display device capable of efficiently using a dead space.

According to an aspect of some example embodiments of the present disclosure, there is provided a display device including: a substrate including first and second display regions and first and second non-display regions; first pixels provided in the first display region; second pixels provided in the second display region; first scan stage circuits disposed in the first non-display region, the first scan stage circuits providing a scan signal to the first pixels; second scan stage circuits disposed in the second non-display region, the second scan stage circuits providing a scan signal to the second pixels; dummy scan stage circuits disposed in the second non-display region, the dummy scan stage circuits being disposed between the second scan stage circuits; and a scan bridge line disposed in the second non-display region, the scan bridge line connecting one second scan stage circuit among the second scan stage circuits and a dummy scan stage circuit adjacent thereto.

The dummy scan stage circuits may be in a floating state.

One side of the scan bridge line may be connected to the one second scan stage circuit, and the other side of the scan bridge line may be connected to the dummy scan stage circuit.

An output terminal of the dummy scan stage circuit may be electrically connected to a second pixel corresponding to the one second scan stage circuit.

The dummy scan stage circuit may be closer to the corresponding second pixel than the one second scan stage circuit.

The scan bridge line may transfer a scan signal of the one second scan stage circuit to a second pixel corresponding to the one second scan stage circuit through the output terminal of the dummy scan stage circuit.

In a plan view, the scan bridge line may extend in the length direction of the substrate, and overlap with a portion of the one second scan stage circuit and a portion of the dummy scan stage circuit.

The one second scan stage circuit may include at least one transistor and lines connected to the transistor.

The scan bridge line may be integrally provided with the output terminal of the dummy scan stage circuit.

The distance between the second scan stage circuits may be larger than that between the first scan stage circuits.

The second display region may be connected to the first display region, and have a width smaller than that of the first display region.

The display device may further include: first emission stage circuits disposed in the first non-display region, the first emission stage circuits supplying an emission control signal to the first pixels; second emission stage circuits disposed in the second non-display region, the second emission stage circuits supplying an emission control signal to the second pixels; dummy emission stage circuits disposed in the second non-display region, the dummy emission stage circuits being disposed between the second emission stage circuits; and an emission bridge line disposed in the second non-display region, the emission bridge line connecting one second emission stage circuit among the second emission stage circuits and a dummy emission stage circuit adjacent thereto.

The dummy emission stage circuits may be in a floating state.

One side of the emission bridge line may be connected to the one second emission stage circuit, and the other side of the emission bridge line may be connected to the dummy emission stage circuit.

An output terminal of the dummy emission stage circuit may be electrically connected to a second pixel corresponding to the one second emission stage circuit.

The emission bridge line may transfer an emission control signal of the one second emission stage circuit to a second pixel corresponding to the one second emission stage circuit through the output terminal of the dummy emission stage circuit.

The one second emission stage circuit may include at least one transistor and lines connected to the transistor.

The emission bridge line may be integrally provided with the output terminal of the dummy emission stage circuit.

The distance between the second emission stage circuits may be larger than that between the first emission stage circuits.

According to another aspect of some example embodiments of the present disclosure, there is provided a display device including: a substrate including first and second display regions and first and second non-display regions; first pixels provided in the first display region; second pixels provided in the second display region; first scan stage circuits disposed in the first non-display region, the first scan stage circuits providing a scan signal to the first pixels; first emission stage circuits disposed in the first non-display region, the first emission stage circuits providing an emission control signal to the first pixels; second scan stage circuits disposed in the second non-display region, the second scan stage circuits providing a scan signal to the second pixels; dummy scan stage circuits disposed in the second non-display region, the dummy scan stage circuits being disposed between the second scan stage circuits; second emission stage circuits disposed in the second non-display region, the second emission stage circuits providing an emission control signal to the second pixels; dummy emission stage circuits disposed in the second non-display region, the dummy emission stage circuits being disposed between the second emission stage circuits; a scan bridge line disposed in the second non-display region, the scan bridge line connecting one second scan stage circuit among the second scan stage circuits and a dummy scan stage circuit adjacent thereto; and an emission bridge line disposed in the second non-display region, the emission bridge line connecting one second emission stage circuit among the second emission stage circuits and a dummy emission stage circuit adjacent thereto.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of some example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
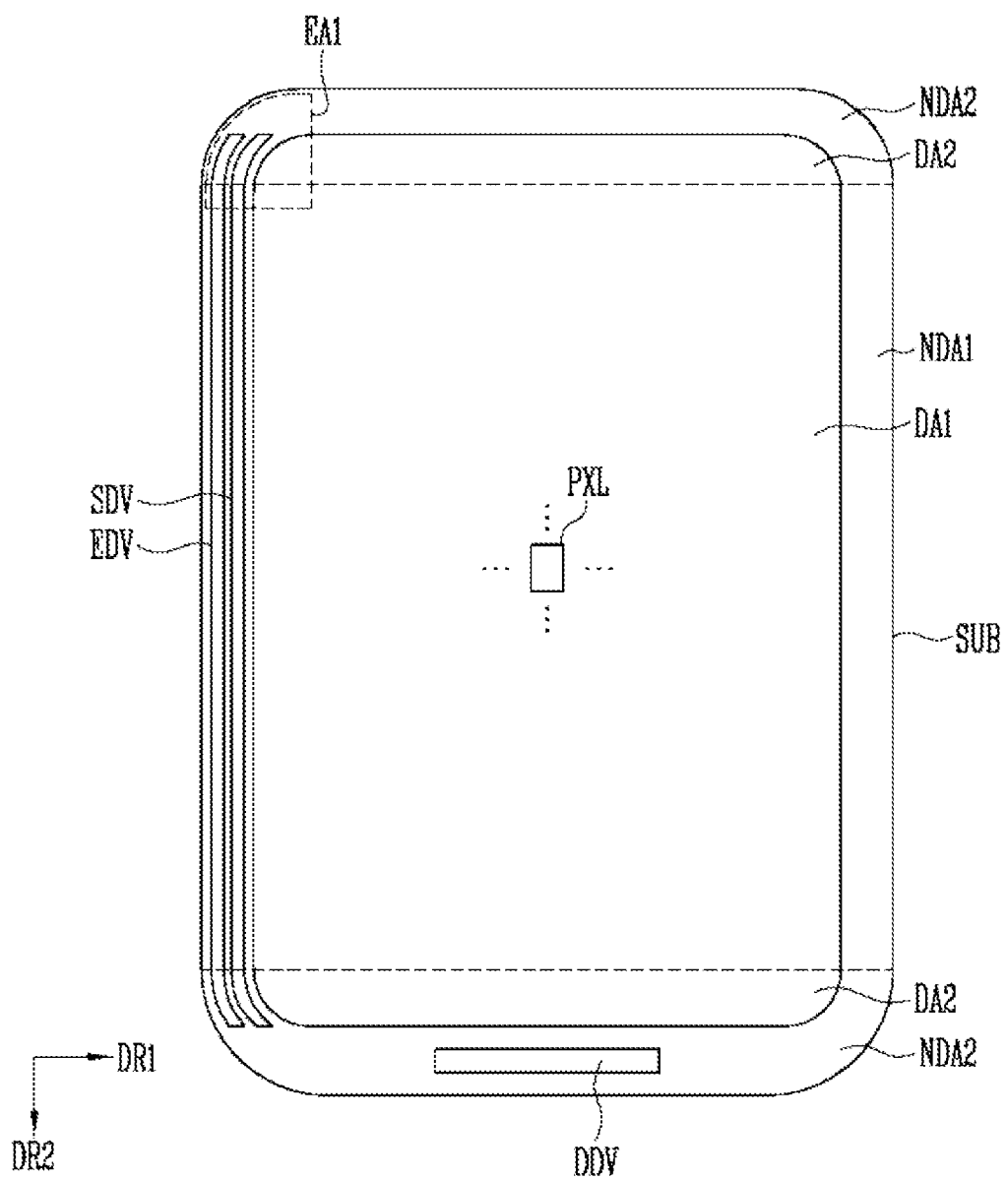
FIG. 1 is a plan view illustrating a display device according to some example embodiments of the present disclosure.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, aspects of some example embodiments of the present disclosure will be described in more detail with reference to the accompanying drawings.

FIG. 1 is a plan view illustrating a display device according to some example embodiments of the present disclosure.

Referring to FIG. 1, the display device according to some example embodiments of the present disclosure may include a substrate SUB, pixels PXL provided on the substrate SUB, a driving unit for driving the pixels PXL, and a line unit for connecting the pixels PXL and the driving unit.

The substrate SUB may have an approximately rectangular shape. In some example embodiments of the present disclosure, the substrate SUB may include a pair of short sides parallel to each other in a first direction DR1 and a pair of long sides parallel to each other in a second direction DR2. However, the shape of the substrate SUB is not limited thereto, and the substrate SUB may have various shapes.

In some example embodiments of the present disclosure, when the substrate SUB has linear sides, at least some of corners of each of the shapes may be formed in a curve. For example, when the substrate SUB has a rectangular shape, a portion at which adjacent linear sides meet each other may be replaced with a curve having a predetermined curvature.

When the substrate SUB includes a plurality of regions, each region may have various shapes such as a closed polygon including linear sides, a circle and an ellipse, including curved sides, and a semicircle and a semi-ellipse, including linear and curved sides.

The substrate SUB may include a display region and a non-display region provided at at least one side of the display region.

The display region may be a region in which the pixels PXL for displaying an image are provided. The display region may have various shapes. For example, the display region may have a shape corresponding to the substrate SUB.

In some example embodiments of the present disclosure, the display region may include a first display region DA1 and two second display regions DA2. The second display regions DA2 may be located at both sides of the first display region DA1, which are opposite to each other. The second display regions DA2 may have a polygonal shape of which width decreases when becoming distant from the first display region DA1. The second display regions DA2 may have an area smaller than that of the first display region DA1.

The pixels PXL may be provided in the display region on the substrate SUB. Each pixel PXL is a minimum unit for displaying an image, and may be provided in plurality in the display region. Each pixel PXL may emit light of any one color among red, green, and blue, but the present disclosure is not limited thereto. For example, each pixel PXL may emit light of any one color among cyan, magenta, yellow, and white.

The pixels PXL may be located in a matrix form along a plurality of rows extending in the first direction DR1 and a plurality of columns extending in the second direction DR2. However, the present disclosure is not limited thereto, and the pixels PXL may be located in various forms.

Each pixel PXL may include, as a display element, an organic light emitting device including an organic emitting layer, but the present disclosure is not limited thereto. For example, each pixel PXL may include various types of display elements such as a liquid crystal element, an electrophoretic element, and an electrowetting element.

The non-display region is a region in which the pixels PXL are not provided, and may be a region in which the image is not displayed. The non-display region may include a first non-display region NDA1 and two second non-display regions NDA2.

The first non-display region NDA1 may be provided at at least one side of the first display region DA1. Each of the two second non-display regions NDA2 may be provided at at least one side of a corresponding second display region DA2.

The driving unit and the line unit may be provided in the non-display region.

The line unit may include a fan-out line for providing a signal to each pixel PXL, a power line for providing a power voltage to each pixel PXL, and the like. In addition to the fan-out line and the power line, the line unit may further include other lines, if necessary.

The driving unit may include a scan driver SDV for providing a scan signal to each pixel PXL along a scan line, an emission driver EDV for providing an emission control signal to each pixel PXL along an emission control line, a data driver DDV for providing a data signal to each pixel PXL along a data line, and a timing controller (not shown). The timing controller controls the scan driver SDV, the emission driver EDV, and the data driver DDV.

Figure 2:
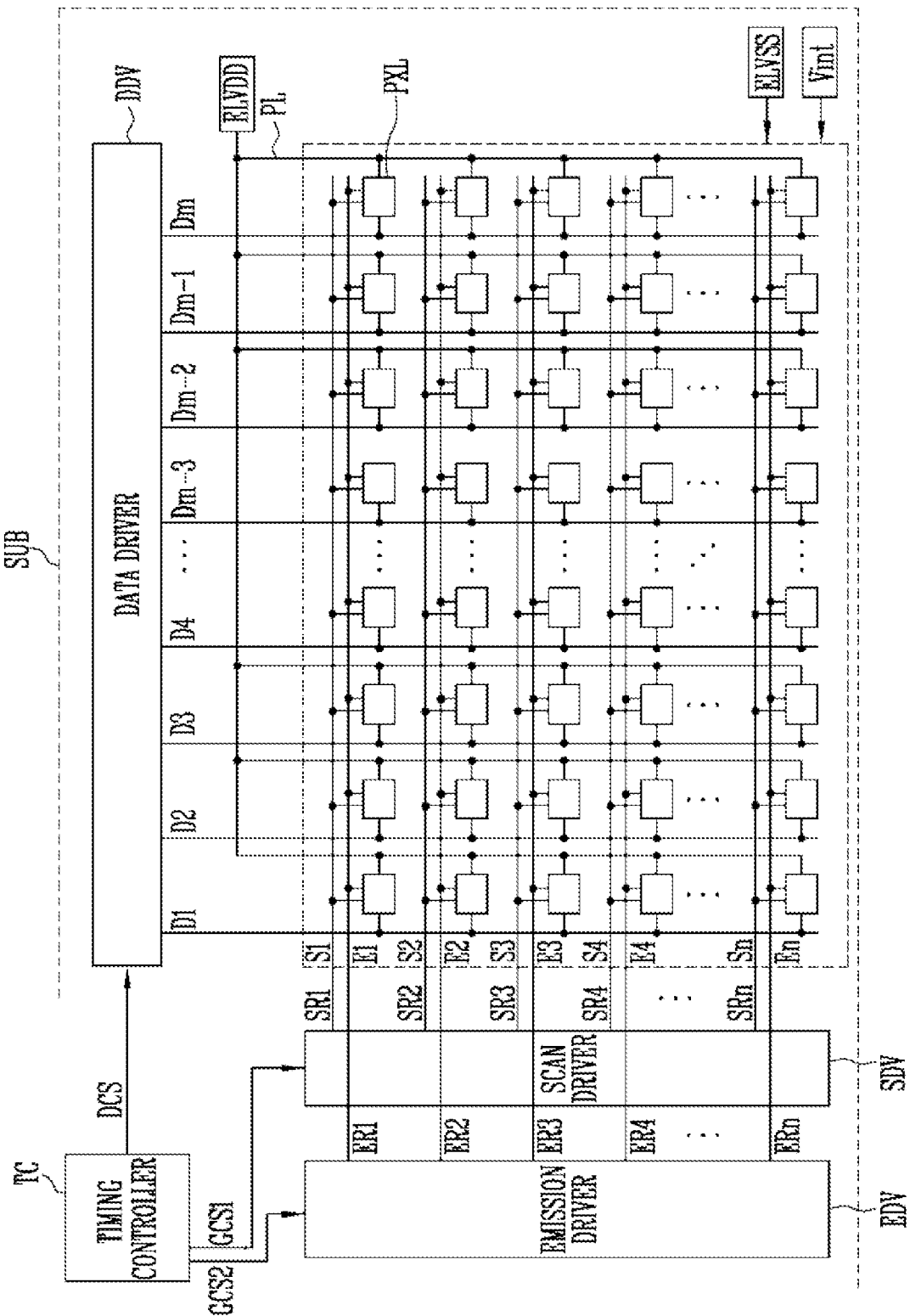
FIG. 2 is a block diagram illustrating an embodiment of pixels and a driving unit in the display device of FIG. 1.

FIG. 2 is a block diagram illustrating some example embodiments of the pixels and the driving unit in the display device of FIG. 1.

Referring to FIGS. 1 and 2, the display device according to some example embodiments of the present disclosure may include a substrate SUB, pixels PXL, a driving unit, and a line unit.

Each pixel PXL may be provided in plurality.

The driving unit may include a scan driver SDV, an emission driver EDV, a data driver DDV, and a timing controller TC. In FIG. 2, positions of the scan driver SDV, the emission driver EDV, the data driver DDV, and the timing controller TC are set for convenience of description. When an actual display device is implemented, the scan driver SDV, the emission driver EDV, the data driver DDV, and the timing controller TC may be located at other positions in the display device.

The line unit may include a scan line, a data line, an emission control line, a power line PL, and an initialization power line, which are located in a display region of the substrate SUB to provide signals to each pixel PXL from the driving unit. The scan line may include a plurality of scan lines S1 to Sn, the emission control line may include a plurality of emission control lines E1 to En, and the data line may include a plurality of data lines D1 to Dm.

The pixels PXL may be provided in the first and second regions DA1 and DA2. When a scan signal is supplied from a scan line corresponding to each pixel PXL, the pixel PXL may be supplied with a data signal from a data line. The pixel PXL supplied with the data signal may control an amount of current flowing from a first power source ELVDD provided through the power line PL to a second power source ELVSS via a light emitting device (not shown).

The scan driver SDV may supply the scan signal to the scan lines S1 to Sn in response to a first gate control signal GCS1 from the timing controller TC. When the scan signal is sequentially supplied to the scan lines S1 to Sn, the pixels PXL may be sequentially selected in units of horizontal lines.

Scan routing lines SR1 to SRn may be connected between the scan driver SDV and the scan lines S1 to Sn. Therefore, the scan driver SDV may be electrically connected to the scan lines S1 to Sn located in the first and second display regions DA1 and DA2 through the scan routing lines SR1 to SRn.

The emission driver EDV may supply the emission control signal to the emission control lines E1 to En in response to a second gate control signal GCS2 from the timing controller TC. For example, the emission driver EDV may sequentially supply the emission control signal to the emission control lines E1 to En.

The emission control signal may be set to a width wider than that of the scan signal. For example, an emission control signal supplied to an ith (i is a natural number) emission control line Ei may be supplied to overlap with a scan signal supplied to an (i−1)th scan line Si−1 and a scan signal supplied to an ith scan line Si during a partial period. Additionally, the emission control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

Emission routing lines ER1 to ERn may be connected between the emission driver EDV and the emission control lines E1 to En. Therefore, the emission driver EDV may be electrically connected to the emission control lines E1 to En located in the first and second display regions DA1 and DA2 through the emission routing lines ER1 to Ern.

The data driver DDV may supply the data signal to the data lines D1 to Dm in response to a data control signal DCS. The data signal supplied to the data lines D1 to Dm may be supplied to pixels PXL selected by the scan signal.

The timing controller TC may supply, to the scan driver SDV and the emission driver EDV, the gate control signals GCS1 and GCS2 generated based on timing signals supplied from the outside. Also, the timing controller TC may supply the data control signal DCS to the data driver DDV.

A start pulse and clock signals may be included in each of the gate control signals GCS1 and GCS2. The start pulse controls timings of a first scan signal or a first light emitting control signal. The clock signals are used to shift the start pulse.

A source start pulse and clock signals may be included in the data control signal DCS. The source start pulse controls a sampling start time of data. The color signals are used to control a sampling operation.

Figure 3:
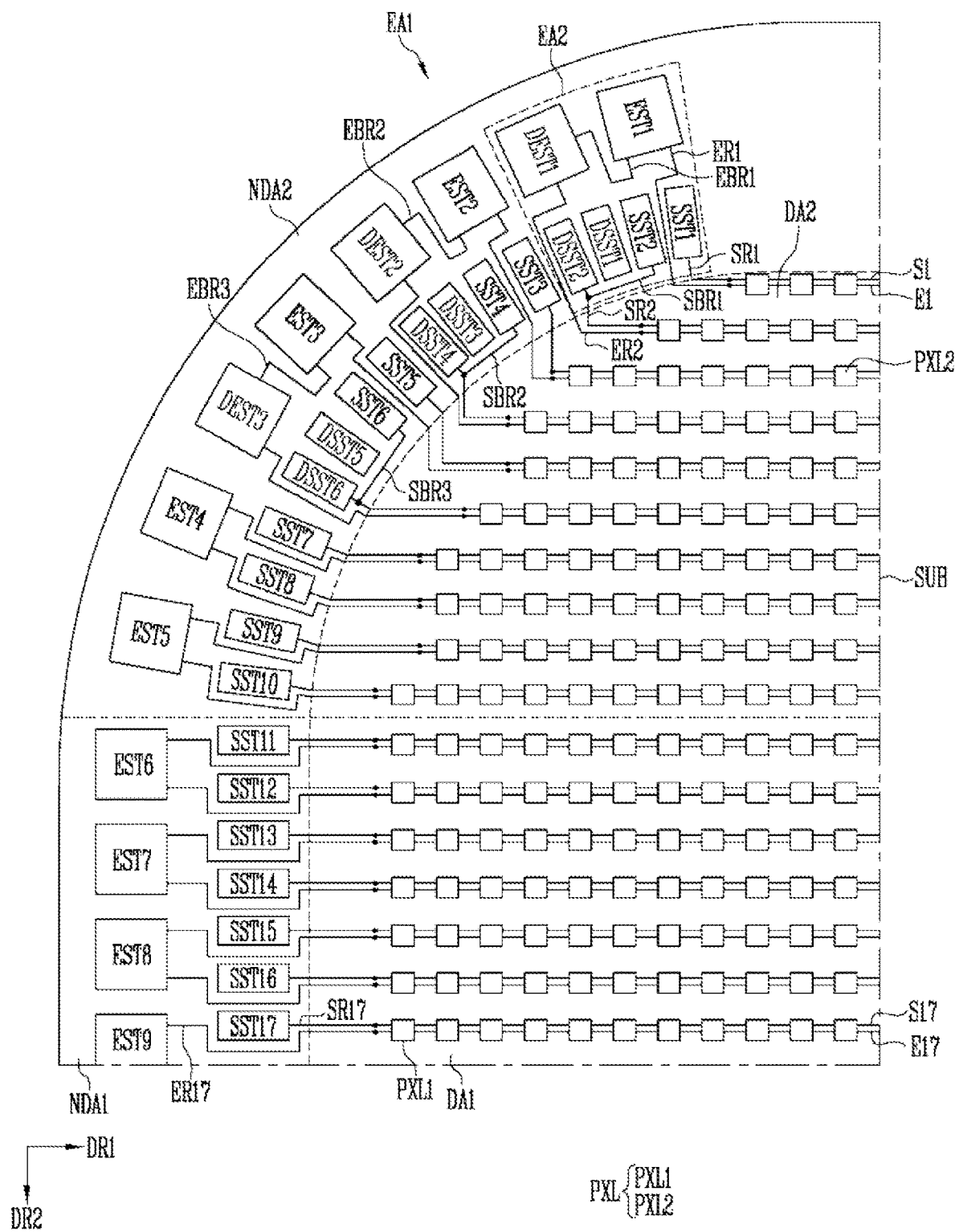
FIG. 3 is an enlarged plan view of portion EA1 of FIG. 1.

FIG. 3 is an enlarged plan view of portion EA1 of FIG. 1.

For convenience of description, FIG. 3 illustrates only an arrangement structure of scan stage circuit, an emission stage circuits, and pixels corresponding thereto. For example, FIG. 3 illustrates example scan stage circuits SST1 to SST17 and example emission stage circuits EST1 to EST9, which are located in the first and second non-display regions. Also, FIG. 3 illustrates example dummy scan stage circuits DSST1 to DSST6 and example dummy emission stage circuits DEST1 to DEST3, which are located in the second non-display region.

Referring to FIGS. 1 and 3, the display device according to the embodiment of the present disclosure may include a substrate SUB on which pixels PXL are provided, a driving unit for driving the pixels PXL, and a line unit for connecting the driving unit and the pixels PXL.

The substrate SUB may include an insulative material such as glass, organic polymer, or quartz. The substrate SUB may be made of a material having flexibility to be bendable or foldable. The substrate SUB may have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material constituting the substrate SUB may be variously changed, and the substrate SUB may be made of a Fiber Reinforced Plastic (FRP), etc.

The substrate SUB may include a display region and a non-display region. The display region may include a first display region DA1 and a second display region DA2. The non-display region may include a first non-display region NDA1 and a second non-display region NDA2.

In some example embodiments of the present disclosure, a corner portion of the second non-display region NDA2 may have a curved shape. A corner portion of the second display region DA2, which corresponds to the corner portion of the second non-display region NDA, may also have a curved shape. Pixel rows of the second display region DA2 may include a small number of pixels when becoming distant from the first display region DA1, so that the corner portion of the second display region DA2 can have a curved shape.

Lengths of the pixel rows located in the second display region DA2 are shortened when becoming distant from the first display region DA1. However, it is unnecessary that the lengths of the pixel rows decrease at the same rate, and the number of pixels PXL2 included in each pixel row may be variously changed depending on the curvature of a curve forming the corner portion of the second display region DA2.

The first non-display region NDA1 may have a linear shape, and the first display region DA1 may have a quadrangular shape. Therefore, all pixel rows of the first display region may include the same pixels PXL1.

The pixels PXL may include a plurality of first pixels PXL1 and a plurality of second pixels PXL2. The first pixels PXL1 may be provided in the first display region DA1, and the second pixels PXL2 may be provided in the second display region DA2. In some example embodiments of the present disclosure, the first pixels PXL1 and the second pixels PXL2 may be implemented to have the same configuration.

The driving unit may include a scan driver SDV and an emission driver EDV, which are located in the non-display region.

The scan driver SDV may include a plurality of scan stage circuits SST1 to SST17. The plurality of scan stage circuits SST1 to SST17 may be implemented with the same circuit. A first scan stage circuit SST1 among the plurality of scan stage circuits SST1 to SST17 may be supplied with an output signal (i.e., a scan signal) of a previous scan stage circuit or a start pulse. For example, the first scan stage circuit SST1 may be supplied with the start pulse, and each of the other scan stage circuits SST2 to SST17 may be supplied with an output signal of a previous scan stage circuit.

The plurality of scan stage circuits SST1 to SST17 may be divided into first scan stage circuits SST11 to SST17 corresponding to the first non-display region NDA1 and second scan stage circuits SST1 to SST10 corresponding to the second non-display region NDA2.

The emission driver EDV may include a plurality of emission stage circuits EST1 to EST 9. The plurality of emission stage circuits EST1 to EST 9 may be implemented with the same circuit. A first emission stage circuit EST1 among the plurality of emission stage circuits EST1 to EST 9 may be supplied with an output signal (i.e., an emission control signal) of a previous emission stage circuit or a start pulse. For example, the first emission stage circuit EST1 may be supplied with the start pulse, and each of the other emission stage circuits EST2 to EST9 may be supplied with an output signal of a previous emission stage circuit.

The plurality of emission stage circuits EST1 to EST9 may be divided into first emission stage circuits EST6 to EST9 corresponding to the first non-display region NDA1 and second emission stage circuits EST1 to EST5 corresponding to the second non-display region NDA2.

Unlike the first non-display region NDA1, the second non-display region NDA2 has a curved shape. Hence, in order to efficiently use the second non-display region NDA2 that is a dead space, it is necessary to set the arrangement structure of the second scan stage circuits SST1 to SST10 differently from that of the first scan stage circuits SST11 to SST17 in the first non-display region NDA1.

For example, the distance between the second scan stage circuits SST1 to SST10 may be set larger than that between the first scan stage circuits SST11 to SST17. The distance between the first scan stage circuits SST11 to SST17 may be constant.

The distance between the second scan stage circuits SST1 to SST10 may increase when becoming distant from the first non-display region NDA1.

In addition, the second scan stage circuits SST1 to SST10 may have a predetermined slope as compared with the first scan stage circuits SST11 to SST17. For example, the slope of the second scan stage circuits SST1 to SST10 may increase when becoming distant from the first non-display region NDA1.

The distance between the second emission stage circuits EST1 to EST5 may be set larger than that between the first emission stage circuits EST6 to EST9. The distance between the first emission stage circuits EST6 to EST9 may be constant.

The distance between the second emission stage circuits EST1 to EST5 may increase when becoming distant from the first non-display region NDA1.

In addition, the second emission stage circuits EST1 to EST5 may have a predetermined slope as compared with the first emission stage circuits EST6 to EST9.

For example, the slope of the second emission stage circuits EST1 to EST5 may increase when becoming distant from the first non-display region NDA1.

The line unit may include a plurality of scan routing lines SR1 to SR17 and a plurality of emission routing lines ER1 to ER17.

The scan routing lines SR1 to SR17 may be divided into first scan routing lines SR11 to SR17 corresponding to the first non-display region NDA1 and second scan routing lines SR1 to SR10 corresponding to the second non-display region NDA2.

Therefore, the first scan stage circuits SST11 to SST17 may be electrically connected to corresponding scan lines S11 to S17 through the first scan routing lines SR11 to SR17. In addition, the second scan stage circuits SST1 to SS10 may be electrically connected to corresponding scan lines S1 to S1 to S10 through the second scan routing lines SR1 to SR10.

In some example embodiments of the present disclosure, because the corner portion of the second display region DA2 is set to have a curved shape, the length of the second scan routing lines SR1 to SR10 may be set longer than that of the first scan routing lines SR11 to SR17.

The emission routing lines ER1 to ER17 may be divided into first emission routing lines ER11 to ER17 corresponding to the first non-display region NDA1 and second emission routing lines ER1 to ER10 corresponding to the second non-display region NDA2.

Therefore, the first emission stage circuits EST6 to EST9 may be electrically connected to corresponding emission control lines E11 to E17 through the first emission routing lines ER11 to ER17. In addition, the second emission stage circuits EST1 to EST5 may be electrically connected to corresponding emission control lines E1 to E10 through the second emission routing lines ER1 to ER10.

The length of the second emission routing lines ER1 to ER10 may be set larger than that of the first emission routing lines ER11 to ER17.

Meanwhile, dummy scan stage circuits DSST1 to DSST6 and dummy emission stage circuits DEST1 to DEST3 may be provided in the second non-display region NDA2.

FIG. 3 illustrates a case where the dummy scan stage circuits DSST1 to DSST6 are located between some of the second scan stage circuits SST1 to SST10. Also, FIG. 3 illustrates a case where the dummy emission stage circuits DEST1 to DEST3 are located between some of the second emission stage circuits EST1 to EST5.

The dummy scan stage circuits DSST1 to DSST6 may include first to sixth dummy scan stage circuits DSST1 to DSST6.

The first and second dummy scan stage circuits DSST1 and DSST2 may be located between second scan stage circuits SST2 and SST3 located adjacent to each other. The third and fourth dummy scan stage circuits DSST3 and DSST4 may be located between second scan stage circuits SST4 and SST5 located adjacent to each other. The fifth and sixth dummy scan stage circuits DSST5 and DSST6 may be located between second scan stage circuits SST6 and SST7 located adjacent to each other.

In some example embodiments of the present disclosure, it is described that two dummy scan stage circuits are located between two second scan stage circuits located adjacent to each other, but the present disclosure is not limited thereto. For example, three dummy scan stage circuits or one dummy scan stage circuit may be located between two second scan stage circuits located adjacent to each other.

That is, the number of dummy scan stage circuits DSST1 to DSST6 may be differently set depending on a position in the second non-display region NDA2.

The dummy scan stage circuits DSST1 to DSST6 may have the same circuit structure as the second scan stage circuits SST1 to SST10, but an operation of outputting a scan signal is not performed. Also, the dummy scan stage circuits DSST1 to DSST6 may have a structure in which some circuit configurations of the second scan stage circuits SST1 to SST10 are removed.

The dummy emission stage circuits DEST1 to DEST3 may include first to third dummy emission stage circuits DEST1, DEST2, and DEST3.

The first dummy emission stage circuit DEST1 may be located between two second emission stage circuits EST1 and EST2 located adjacent to each other. The second dummy emission stage circuit DEST2 may be located between two second emission stage circuits EST2 and EST3 located adjacent to each other. The third dummy emission stage circuit DEST3 may be located between two second emission stage circuits EST3 and EST4 located adjacent to each other.

In some example embodiments of the present disclosure, it is described that one dummy emission stage circuit is located between two second emission stage circuits located adjacent to each other, but the present disclosure is not limited thereto.

The dummy emission stage circuits DEST1 to DEST3 may have the same circuit structure as the second emission stage circuits EST1 to EST5, but an operation of outputting an emission control signal is not performed. Also, the dummy emission stage circuits DEST1 to DEST3 may have a structure in which some circuit configurations of the second emission stage circuits EST1 to EST9 are removed.

In some example embodiments of the present disclosure, one dummy emission stage circuit may correspond to two dummy scan stage circuits. For example, the first dummy emission stage circuit DEST1 may correspond to the first and second dummy scan stage circuits DSST1 and DSST2, the second dummy emission stage circuit DEST2 may correspond to the third and fourth dummy scan stage circuits DSST3 and DSST4, and the third dummy emission stage circuit DEST3 may correspond to the fifth and sixth dummy scan stage circuits DSST5 and DSST6.

Meanwhile, a scan bridge line and an emission bridge line may be located in the second non-display region NDA2.

The scan bridge line is located in the second non-display region NDA2, and may electrically connect one second scan stage circuit and one dummy scan stage circuit adjacent to the one second scan stage circuit.

The scan bridge line may include first to scan bridge lines SBR1, SBR2, and SBR3.

One side of the first scan bridge line SBR1 may be connected to one second scan stage circuit SST2, and the other side of the first scan bridge line SBR1 may be connected to the second dummy scan stage circuit DSST2. Therefore, the one second scan stage circuit SST2 and the second dummy scan stage circuit DSST2 may be electrically connected to each other through the first scan bridge line SBR1.

One side of the second scan bridge line SBR2 may be connected to one second scan stage circuit SST4, and the other side of the second scan bridge line SBR2 may be connected to the fourth dummy scan stage circuit DSST4. Therefore, the one second scan stage circuit SST4 and the fourth dummy scan stage circuit DSST4 may be electrically connected to each other through the second scan bridge line SBR2.

One side of the third scan bridge line SBR3 may be connected to one second scan stage circuit SST6, and the other side of the third scan bridge line SBR3 may be connected to the sixth dummy scan stage circuit DSST6. Therefore, the one second scan stage circuit SST6 and the sixth dummy scan stage circuit DSST6 may be electrically connected to each other through the third scan bridge line SBR3.

Hereinafter, for convenience of description, the one second scan stage circuit SST2 connected to the first scan bridge line SBR1 is referred to as a (2-2)th scan stage circuit SST2, the one second scan stage circuit SST4 connected to the second scan bridge line SBR2 is referred to as a (2-4)th scan stage circuit SST4, and the one second scan stage circuit SST6 connected to the third scan bridge line SBR3 is referred to as a (2-6)th scan stage circuit SST6.

In addition, for convenience of description, a second pixel PXL2 corresponding to the (2-2)th scan stage circuit SST2 is referred to as a (2-2)th pixel PXL2, a second pixel PXL2 corresponding to the (2-4)th scan stage circuit SST4 is referred to as a (2-4)th pixel PXL2, and a second pixel PXL2 corresponding to the (2-6)th scan stage circuit SST6 is referred to as a (2-6)th pixel PXL2.

The (2-2)th scan stage circuit SST2 may output a scan signal using, as a start pulse, a scan signal of a (2-1)th scan stage circuit SST1 located at a previous stage.

The scan signal output from the (2-2)th scan stage circuit SST2 may be transferred to the (2-2)th pixel PXL2 through the first scan bridge line SBR1 and an output terminal of the second dummy scan stage circuit DSST2.

In some example embodiments of the present disclosure, the (2-2)th pixel PXL2 may be located more adjacent (e.g., closer) to the second dummy scan stage circuit DSST2 than the (2-2)th scan stage circuit SST2. This results from a difference in position, caused when the corner portion of the second non-display region NDA2 is set to have a curved shape.

The (2-2)th pixel PXL2 may receive the scan signal from the second dummy scan stage circuit DSST2 located more adjacent (e.g., closer) thereto than the (2-2)th scan stage circuit SST2 that outputs an actual scan signal.

In some example embodiments of the present disclosure, a signal for driving from the outside and a scan signal of the (2-2)th scan stage circuit SST2 may not be transmitted to an input terminal of the second dummy scan stage circuit DSST2. Therefore, the second dummy scan stage circuit DSST2 does not generate a scan signal because an operation of outputting the scan signal is not performed. In this case, the second dummy scan stage circuit DSST2 may be in a floating state in which it is electrically isolated. The second dummy scan stage circuit DSST2 may transfer the scan signal of the (2-2)th scan stage circuit SST2 to the (2-2)th pixel PXL2 through the first scan bridge line SBR1 connected to an output terminal of the second dummy scan stage circuit DSST2. That is, the second dummy scan stage circuit DSST2 does not perform an operation of outputting the scan signal like the (2-2)th scan stage circuit SST2, but may serve as a medium for transferring the scan signal of the (2-2)th scan stage circuit SST2 to the (2-2)th pixel PXL2.

In the above-described embodiment, it has been described that the (2-2)th scan stage circuit SST2 is connected to the second dummy stage circuit DSST2 by the first scan bridge line SBR1, but the present disclosure is not limited thereto.

For example, when the first dummy scan stage circuit DSST1 is located more adjacent (e.g., closer) to the (2-2)th pixel PXL2 than the second dummy scan stage circuit DSST2, the (2-2)th scan stage circuit SST2 may be connected to the first dummy scan stage circuit DSST1 by the first scan bridge line SBR1.

Although FIG. 3 illustrates that the first scan bridge line SBR1 is located in the second non-display region NDA2 by bypassing the first and second dummy scan stage circuits DSST1 and DSST2, the present disclosure is not limited thereto.

For example, the first scan bridge line SBR1 may be located to bypass the first and second dummy scan stage circuits DSST1 and DSST2 while overlapping with the first and second dummy scan stage circuits DSST1 and DSST2.

The second and third scan bridge lines SBR2 and SBR3 may also be located in the second non-display region NDA2 in the same manner as the first scan bridge line SBR1.

A scan signal output from the (2-4)th scan stage circuit SST4 may be transferred to the (2-4)th pixel PXL2 through the second scan bridge line SBR2 and an output terminal of the fourth dummy scan stage circuit DSST4.

The (2-4)th pixel PXL2 may be located more adjacent (e.g., closer) to the fourth dummy scan stage circuit DSST4 than the (2-4)th scan stage circuit SST4. This results from a difference in position, caused when the corner portion of the second non-display region NDA2 is set to have a curved shape.

The (2-4)th pixel PXL2 may receive the scan signal from the fourth dummy scan stage circuit DSST4 located more adjacent (e.g., closer) thereto than the (2-4)th scan stage circuit SST4 that outputs an actual scan signal.

The fourth dummy scan stage circuit DSST4 may be in a floating state.

The fourth dummy scan stage circuit DSST4 may immediately transfer the scan signal of the (2-4)th scan stage circuit SST4 to the (2-4)th pixel PXL2 through the second scan bridge line SBR2. That is, the fourth dummy scan stage circuit DSST4 does not perform an operation of outputting the scan signal like the (2-4)th scan stage circuit SST4, but may perform only a function of transferring the scan signal of the (2-4)th scan stage circuit SST4 to the (2-4)th pixel PXL2.

A scan signal output from the (2-6)th scan stage circuit SST6 may be transferred to the (2-6)th pixel PXL2 through the third scan bridge line SBR3 and an output terminal of the sixth dummy scan stage circuit DSST6.

The (2-6)th pixel PXL2 may be located more adjacent (e.g., closer) to the sixth dummy scan stage circuit DSST6 than the (2-6)th scan stage circuit SST6. This results from a difference in position, caused when the corner portion of the second non-display region NDA2 is set to have a curved shape.

The (2-6)th pixel PXL2 may receive the scan signal from the sixth dummy scan stage circuit DSST6 located more adjacent (e.g., closer) thereto than the (2-6)th scan stage circuit SST6 that outputs an actual scan signal.

The sixth dummy scan stage circuit DSST6 may be in a floating state.

The sixth dummy scan stage circuit DSST6 may immediately transfer the scan signal of the (2-6)th scan stage circuit SST4 to the (2-6)th pixel PXL2 through the third scan bridge line SBR3. That is, the sixth dummy scan stage circuit DSST6 does not perform an operation of outputting the scan signal like the (2-6)th scan stage circuit SST6, but may perform only a function of transferring the scan signal of the (2-6)th scan stage circuit SST6 to the (2-6)th pixel PXL2.

As described above, each of the second, fourth, and sixth dummy scan stage circuits DSST2, DSST4, and DSST6 may transfer a scan signal from a corresponding second scan stage circuit to a corresponding second pixel PXL2 through a corresponding scan bridge line.

In some example embodiments of the present disclosure, the dummy scan stage circuits may be located in the second non-display region NDA2 to compensate for a difference in position between the second scan stage circuits SST1 to SST10 located in the shape of the second non-display region NDA2 and second pixels PXL2 corresponding thereto.

When the first to sixth dummy scan stages DSST1 to DSST6 are located between the second scan stage circuits SST1 to SST10, the critical dimension (CD) uniformity of the scan driver SDV corresponding to the second non-display region NDA2 can be increased.

In some example embodiments of the present disclosure, the scan bridge lines SBR1 to SBR3 are located in the second non-display region NDA2, so that a scan signal can be directly transferred to a corresponding second pixel PXL2 through a dummy scan stage circuit located close to the second pixel PXL2.

Accordingly, in the display device according to the embodiment of the present disclosure, the spatial efficiency of the second non-display region NDA2 can be improved while the scan signal is being provided to the corresponding second pixel PXL2 without any signal delay. In other words, in the display device according to the embodiment of the present disclosure, a dead space can be efficiently used.

The emission bridge line is located in the second non-display region NDA2, and may electrically connect one second emission stage circuit and one dummy emission stage circuit adjacent to the one second emission stage circuit.

The emission bridge line may include first to third emission bridge lines EBR1, EBR2, and EBR3.

One side of the first emission bridge line EBR1 may be connected to one second emission stage circuit EST1, and the other side of the first emission bridge line EBR1 may be connected to the first dummy emission stage circuit DEST1. Therefore, the one second emission stage circuit EST1 and the first dummy emission stage circuit DEST1 may be electrically connected to each other through the first emission bridge line EBR1.

One side of the second emission bridge line EBR2 may be connected to one second emission stage circuit EST2, and the other side of the second emission bridge line EBR2 may be connected to the second dummy emission stage circuit DEST2. Therefore, the one second emission stage circuit EST2 and the second dummy emission stage circuit DEST2 may be electrically connected to each other through the second emission bridge line EBR2.

One side of the third emission bridge line EBR3 may be connected to one second emission stage circuit EST3, and the other side of the third emission bridge line EBR3 may be connected to the third dummy emission stage circuit DEST3. Therefore, the one second emission stage circuit EST3 and the third dummy emission stage circuit DEST3 may be electrically connected to each other through the third emission bridge line EBR3.

In some example embodiments of the present disclosure, each of the second emission stage circuits EST1 to EST3 may correspond to a pair of second scan stage circuits adjacent to each other. Therefore, one second emission stage circuit may transfer an emission control signal to second pixels PXL2 located on two pixel rows located adjacent to each other along the second direction of the substrate SUB.

Hereinafter, for convenience of description, one second emission stage circuit EST1 connected to the first emission bridge line EBR1 is referred to as a (2-1)th emission stage circuit EST1, one second emission stage circuit EST2 connected to the second emission bridge line EBR2 is referred to as a (2-2)th emission stage circuit EST2, and one second emission stage circuit EST3 connected to the third emission bridge line EBR3 is referred to as a (2-3)th emission stage circuit.

An emission control signal output from the (2-1)th emission stage circuit EST1 may be transferred to second pixels PXL2 located on a first pixel row of the second display region DA2 through a corresponding emission routing line ER1.

Also, the emission control signal of the (2-1)th emission stage circuit EST1 may be transferred to the first dummy emission stage circuit DEST1 through the first emission bridge line EBR1. The first dummy emission stage circuit DEST1 may transfer the emission control signal to second pixels PXL2 located on a second pixel row that is the next row of the first pixel row through a corresponding emission routing line ER2.

In some example embodiments of the present disclosure, the second pixels PXL2 located on the second pixel row may be located more adjacent (e.g., closer) to the first dummy emission stage circuit DEST1 than the (2-1)th emission stage circuit EST1. This results from a difference in position, caused when the corner portion of the second non-display region NDA2 is set to have a curved shape.

The second pixels PXL2 located on the second pixel row may receive the emission control signal from the first dummy emission stage circuit DEST1 located more adjacent (e.g., closer) thereto than the (2-1)th emission stage circuit EST1.

In some example embodiments of the present disclosure, a signal for driving from the outside and an emission control signal of the (2-1)th emission stage circuit EST1 may not be transmitted to an input terminal of the first dummy emission stage circuit DEST1. Therefore, the first dummy emission stage circuit DEST1 does not generate an emission control signal because an operation of outputting the emission control signal in not performed. In this case, the first dummy emission stage circuit DEST1 may be in a floating state in which it is electrically isolated.

The first dummy emission stage circuit DEST1 may directly transfer the emission control signal of the (2-1)th emission stage circuit EST1 to the second pixels PXL2 located on the second pixel row through the first emission bridge line EBR1. That is, the first dummy emission stage circuit DEST1 does not perform an operation of outputting the emission control signal like the (2-1)th emission stage circuit EST1, but may perform only a function of transferring the emission control signal of the (2-1)th emission stage circuit EST1 to the second pixels PXL2 located on the second pixel row.

An emission control signal output from the (2-2)th emission stage circuit EST2 may be transferred to second pixels PXL2 located on a third pixel row of the second display region DA2 through a corresponding emission routing line ER3.

Also, the emission control signal of the (2-2)th emission stage circuit EST2 may be transferred to the second dummy emission stage circuit DEST2 through the second emission bridge line EBR2. The second dummy emission stage circuit DEST2 may transfer the emission control signal to second pixels PXL2 located on a fourth pixel row that is the next row of the third pixel row through a corresponding emission routing line ER4.

In some example embodiments of the present disclosure, the second pixels PXL2 located on the fourth pixel row may be located more adjacent (e.g., closer) to the second dummy emission stage circuit DEST2 than the (2-2)th emission stage circuit EST2.

The second dummy emission stage circuit DEST2 may be in a floating state.

The second dummy emission stage circuit DEST2 does not perform an operation of outputting the emission control signal like the (2-2)th emission stage circuit EST2, but may perform only a function of transferring the emission control signal of the (2-2)th emission stage circuit EST2 to the second pixels PXL2 located on the fourth pixel row.

An emission control signal output from the (2-3)th emission stage circuit EST3 may be transferred to second pixels PXL2 located on a fifth pixel row of the second display region DA2 through a corresponding emission routing line ER5.

Also, the emission control signal of the (2-3)th emission stage circuit EST3 may be transferred to the third dummy emission stage circuit DEST3 through the third emission bridge line EBR3. The third dummy emission stage circuit DEST3 may transfer the emission control signal to second pixels PXL2 located on a sixth pixel row that is the next row of the fifth pixel row through a corresponding emission routing line ER6.

In some example embodiments of the present disclosure, the second pixels PXL2 located on the sixth pixel row may be located more adjacent (e.g., closer) to the third dummy emission stage circuit DEST3 than the (2-3)th emission stage circuit EST3.

The third dummy emission stage circuit DEST3 may be in a floating state.

The third dummy emission stage circuit DEST3 does not perform an operation of outputting the emission control signal like the (2-3)th emission stage circuit EST3, but may perform only a function of transferring the emission control signal of the (2-3)th emission stage circuit EST3 to the second pixels PXL2 located on the sixth pixel row.

When the first to third dummy emission stage circuits DEST1, DEST2, and DEST3 are located between the second emission stage circuits EST1 to EST5, the CD uniformity of the emission driver EDV corresponding to the second non-display region NDA2 can be increased.

In some example embodiments of the present disclosure, the first to third emission bridge lines EBR1 to EBR3 are located in the second non-display region NDA2, so that an emission control signal can be directly transferred to a corresponding second pixel PXL2 through a dummy emission stage circuit located close to the second pixel PXL2.

Accordingly, in the display device according to the embodiment of the present disclosure, the spatial efficiency of the second non-display region NDA2 can be improved while the scan signal is being provided to the corresponding second pixel PXL2 without any signal delay.

FIGS. 4A to 4D are plan views illustrating, in various forms, the arrangement structure of the scan stage circuits, the emission stage circuits, the dummy emission stage circuits, and the dummy scan stage circuits, which are located in the second non-display region of FIG. 3.

In FIGS. 4A to 4D, the second scan stage circuits, the dummy scan stage circuits, the second emission stage circuits, and the dummy emission stage circuits, which are located in the second non-display region NDA2, are illustrated for convenience of description.

Referring to FIGS. 4A to 4D, the second scan stage circuits SST1 to SST10, the dummy scan stage circuits DSST1 to DSST6, the second emission stage circuits EST1 to EST5, and the dummy emission stage circuits DEST1 to DEST3 may be provided in the second non-display region NDA2.

In some example embodiments of the present disclosure, two second scan stage circuits adjacent to one second emission stage circuit may constitute a unit driver UDV. For example, the (2-1)th and (2-2)th scan stage circuits SST1 and SST2 adjacent to the (2-1)th emission stage circuit EST1 may constitute the unit driver UDV.

Also, in some example embodiments of the present disclosure, two dummy scan stage circuits adjacent to one dummy emission stage circuit may constitute the unit driver UDV. For example, the first and second dummy scan stage circuits DSST1 and DSST2 adjacent to the first dummy emission stage circuit DEST1 may constitute the unit driver UDV.

Figure 4A:
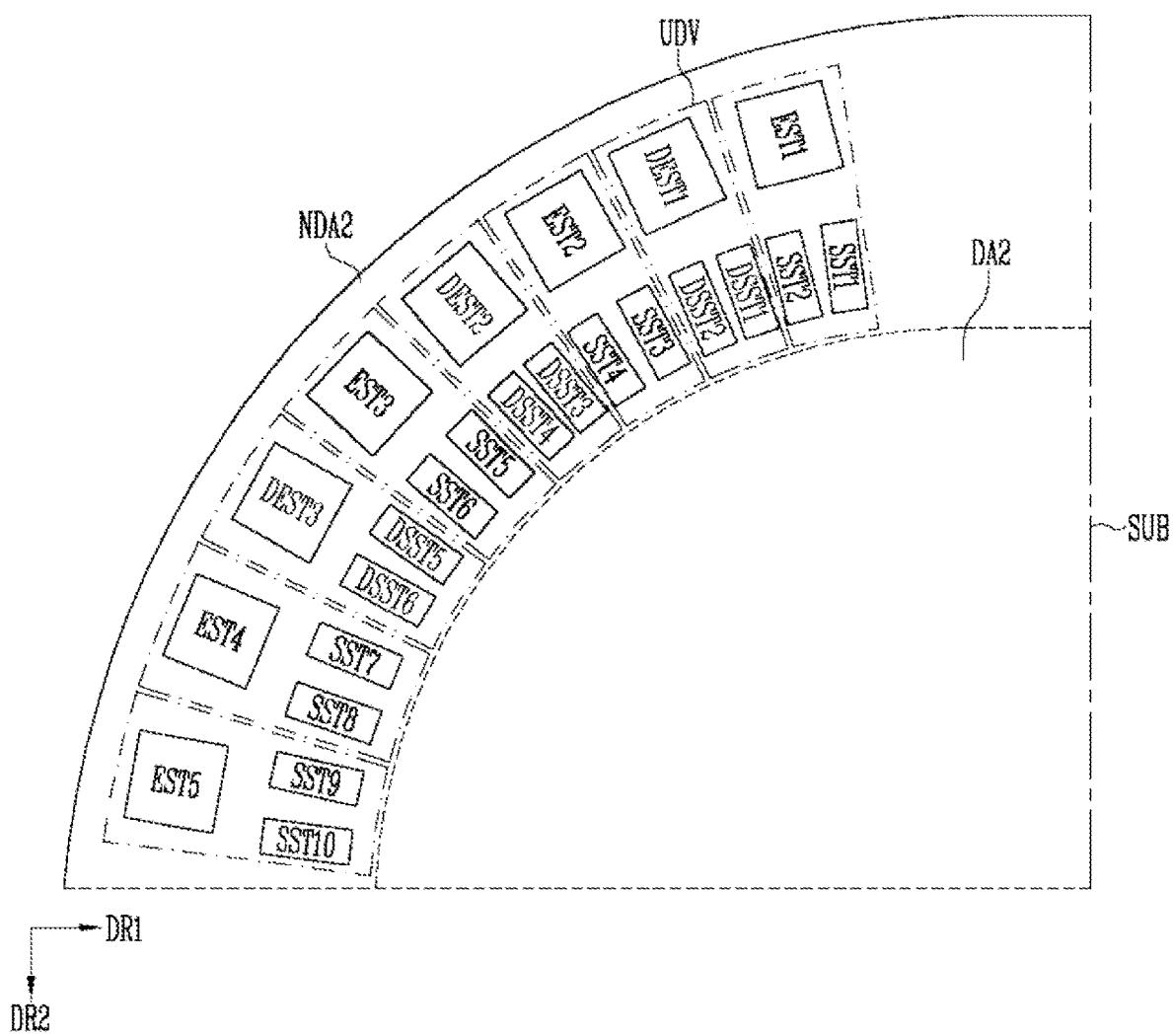
FIGS. 4A to 4D are plan views illustrating, in various forms, an arrangement structure of scan stage circuits, emission stage circuits, dummy emission stage circuits, and dummy scan stage circuits, which are located in a second non-display region of FIG. 3.
Figure 4B:
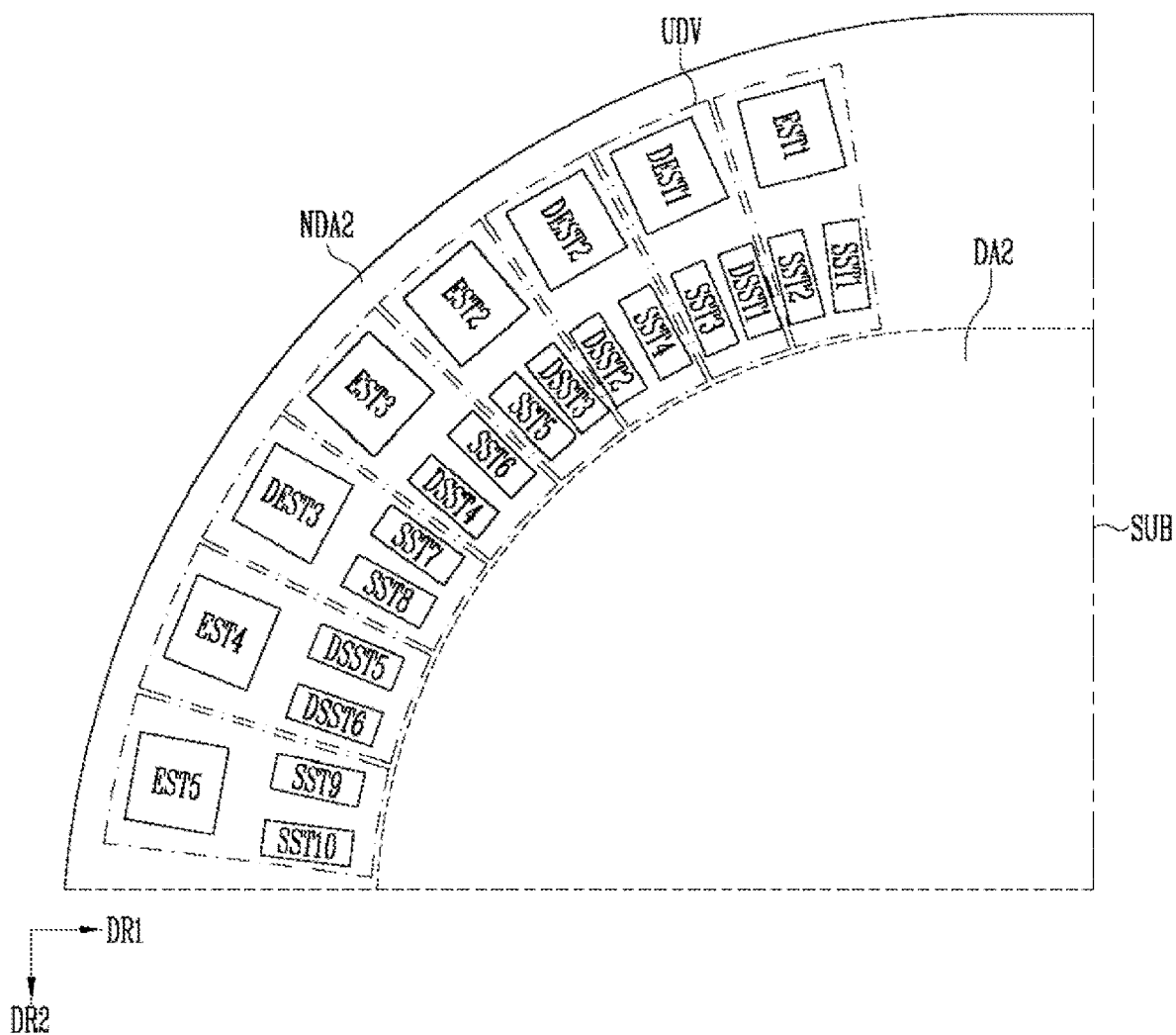

In some embodiments, the unit driver UDV, as shown in FIG. 4B, may be configured with one second emission stage circuit, one second scan stage circuit, and one dummy scan stage circuit.

In addition, the unit driver UDV may be configured with one dummy emission stage circuit, one second scan stage circuit, and one dummy scan stage circuit. In addition, the unit driver UDV may be configured with one second emission stage circuit and a pair of dummy scan stage circuits.

According to some embodiments, the second scan stage circuits SST1 to SST10 and the dummy scan stage circuits DSST1 to DSST6 may be located at the outside of the second emission stage circuits EST1 to EST5 and the dummy emission stage circuits DEST1 to DEST3.

Figure 4C:
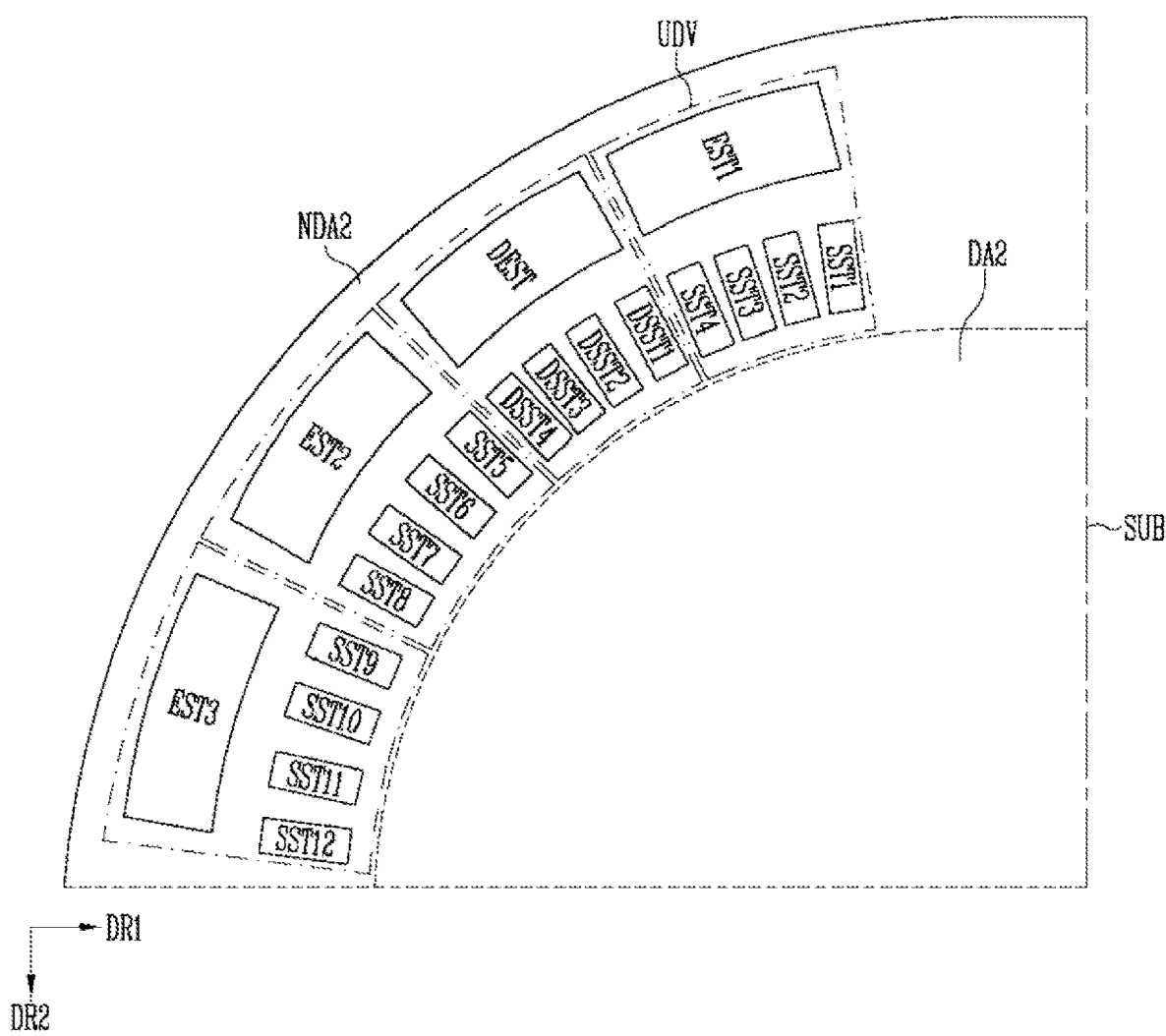

In some embodiments, the unit driver UDV, as shown in FIG. 4C, may be configured with one second emission stage circuit and four second scan stage circuits. In addition, the unit driver UDV may be configured with one dummy emission stage circuit and four dummy scan stage circuits.

Figure 4D:
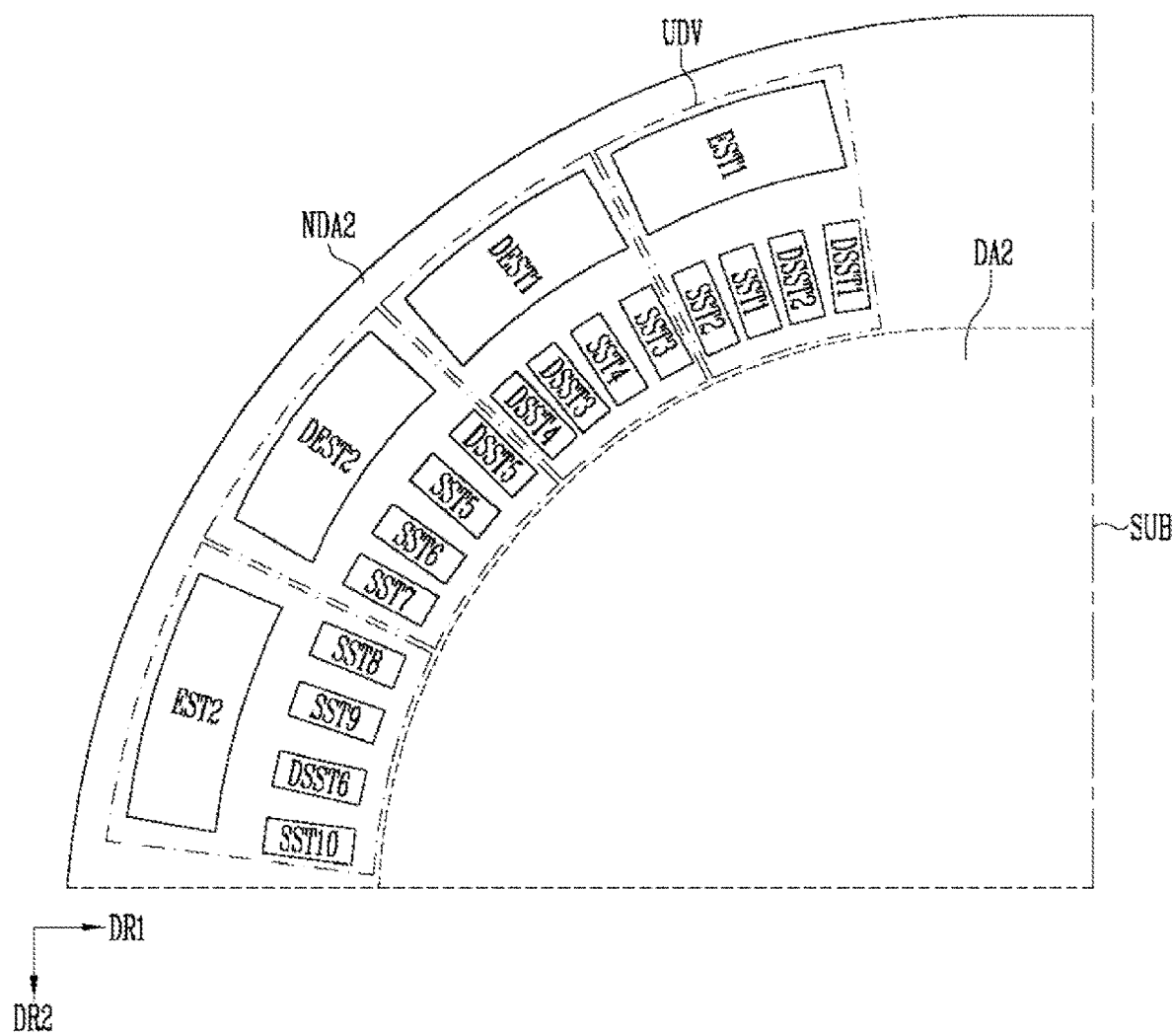

In some embodiments, the unit driver UDV, as shown in FIG. 4D, may be configured with one second emission stage circuit, two second scan stage circuits, and two dummy scan stage circuits. In addition, the unit driver UDV may be configured with one second emission stage circuit, third second scan stage circuits, and one dummy scan stage circuit.

In addition, the unit driver UDV, as shown in FIG. 4D, may be configured with one dummy emission stage circuit, two second scan stage circuits, and two dummy scan stage circuits. In addition, the unit driver UDV may be configured with one dummy emission stage circuit, three second scan stage circuits, and one dummy scan stage circuit.

In some example embodiments of the present disclosure, the unit driver UDV is not limited to the above-described configurations, and may be configured in various manners.

Figure 5:
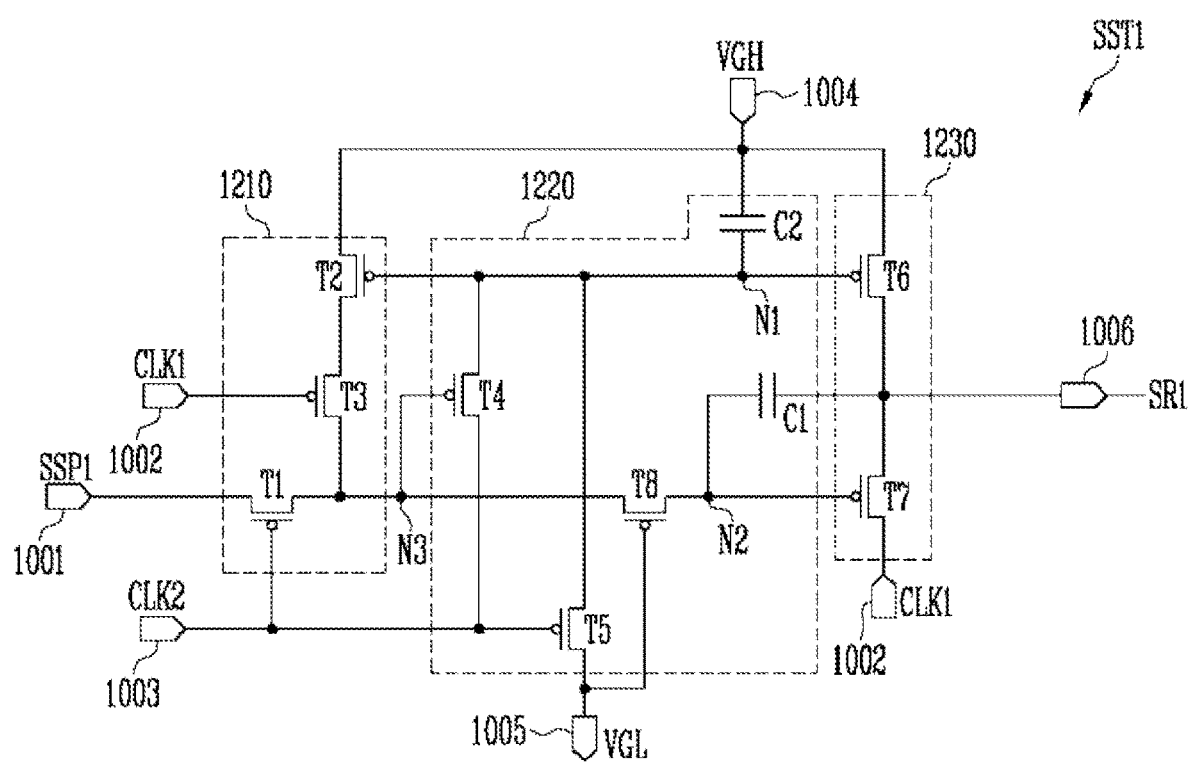
FIG. 5 is a circuit diagram illustrating a (2-1)th scan stage circuit of FIG. 3.
Figure 6:
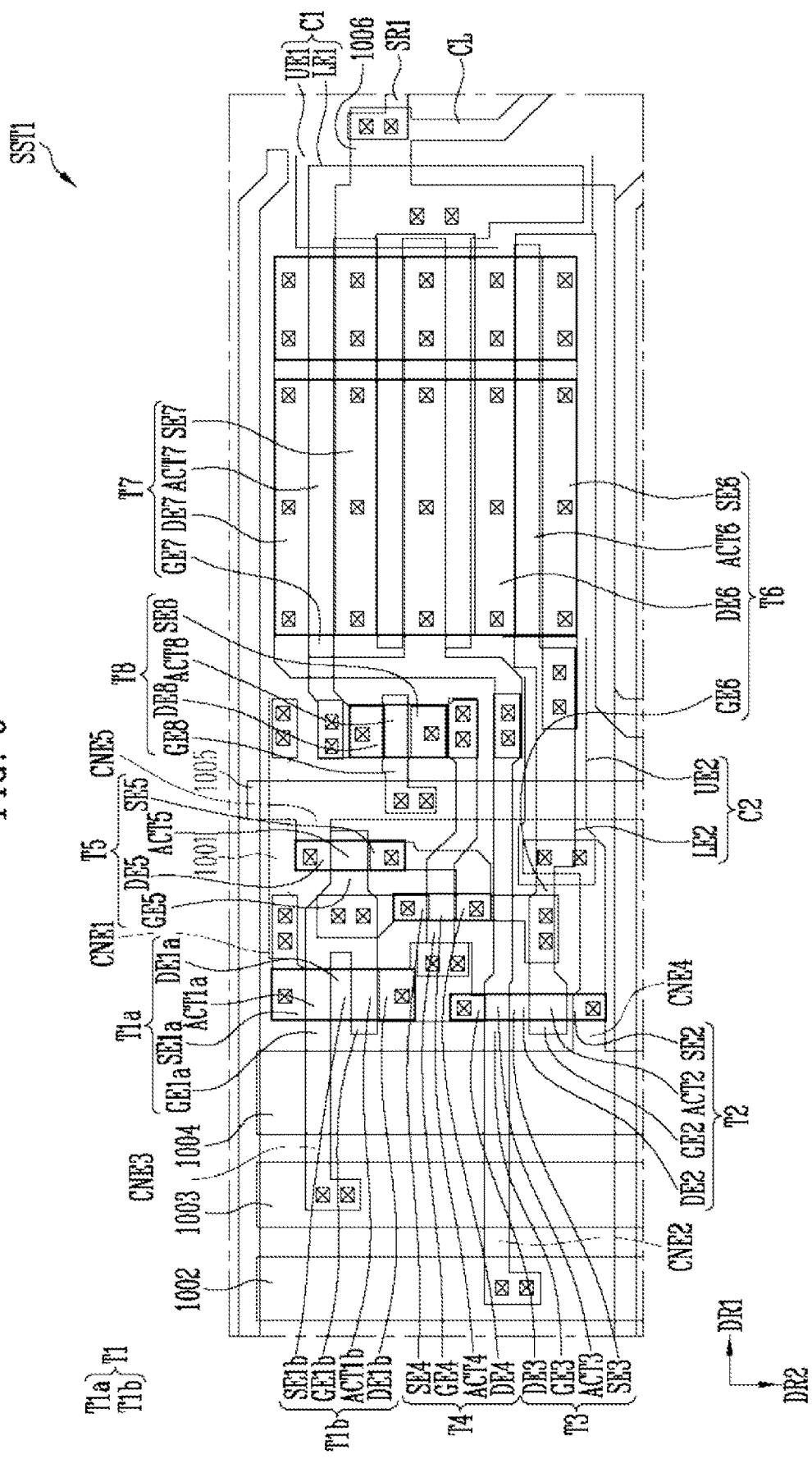
FIG. 6 is a plan view illustrating in detail the (2-1)th scan stage circuit of FIG. 5.

FIG. 5 is a circuit diagram illustrating the (2-1)th scan stage circuit of FIG. 3. FIG. 6 is a plan view illustrating in detail the (2-1)th scan stage circuit of FIG. 5.

Referring to FIGS. 3, 5, and 6, the (2-1)th scan stage circuit SST1 may include a first driving circuit 1210, a second driving circuit 1220, and an output unit 1230.

The output unit 1230 may control a voltage supplied to an output terminal 1006, corresponding to voltages of a first node N1 and a second node N2. To this end, the output unit 1230 may include a sixth transistor T6 and a seventh transistor T7.

The sixth transistor T6 may be connected between a fourth input line 1004 to which a gate high voltage VGH is input and the output terminal 1006. The sixth transistor T6 may control connection between the fourth input line 1004 and the output terminal 1006, corresponding to the voltage applied to the first node N1.

The sixth transistor T6 may include a sixth gate electrode GE6 connected to the first node N1, a sixth drain electrode DE6 connected to the output terminal 1006, and a sixth source electrode SE6 connected to the fourth input line 1004.

Also, the sixth transistor T6 may include a sixth active pattern ACT6 that overlaps with the sixth gate electrode GE6 and is connected to the sixth source electrode SE6 and the sixth drain electrode DE6.

The seventh transistor T7 may be connected between the output terminal 1006 and a second input line to which a first clock signal CLK1 is input. The seventh transistor T7 may control connection between the output terminal 1006 and the second input line 1002, corresponding to the voltage applied to the second node N2.

The seventh transistor T7 may include a seventh gate electrode GE7 connected to the second node N2, a seventh source electrode SE7 connected to the output terminal 1006, and a seventh drain electrode DE7 connected to the second input line 1002.

Also, the seventh transistor T7 may include a seventh active pattern ACT7 that overlaps with the seventh gate electrode GE7 and is connected to the seventh source electrode SE7 and the seventh drain electrode DE7.

The output unit 1230 may be driven as a buffer. Additionally, the sixth and seventh transistors T6 and T7 may be configured as a plurality of transistors connected in parallel to each other as shown in FIG. 6.

The first driving circuit 1210 may control a voltage of a third node N3, corresponding to signals supplied to a first input line 1001, the second input line 1002, and a third input line 1003. To this end, the first driving circuit 1210 may include a first transistor T1, a second transistor T2, and a third transistor T3.

The first transistor T1 may be connected between the first input line 1001 to which a start pulse SSP1 is input and the third node N3 through a first contact electrode CNE1. The first transistor T1 may control connection between the first input line 1001 and the third node N3, corresponding to a second clock signal CLK2 supplied to the third input line 1003.

The first transistor T1 may be provided in a double gate structure to prevent leakage current. The first transistor T1 may include a 1ath transistor T1a and a 1bth transistor T1b.

The 1ath transistor T1a may include a 1ath gate electrode GE1a connected to the third input line 1003 to which the second clock signal CLK2 is input through a third contact electrode CNE3, a 1ath source electrode SE1a connected to the first input line 1001, and a 1ath drain electrode DE1a connected to the 1ath source electrode SE1a. The third contact electrode CNE3 may be integrally provided with the 1ath gate electrode GE1a.

Also, the 1ath transistor T1a may include a 1ath active pattern ACT1a that overlaps with the 1ath gate electrode GE1a and is connected to the 1ath source electrode SE1a and the 1ath drain electrode DE1a.

The 1bth transistor T1b may include a 1bth gate electrode GE1b connected to the third input line 1003, a 1bth source electrode SE1b connected to the 1ath drain electrode DE1a, and a 1bth drain electrode DE1b connected to the third node N3. Also, the 1bth transistor T1b may include a 1bth active pattern ACT1b that overlaps with the 1bth gate electrode GE1b and is connected to the 1bth source electrode SE1b and the 1bth drain electrode DE1b.

The second transistor T2 and the third transistor T3 may be connected in series to each other between the third node and the fourth input line 1004.

Actually, the third transistor T3 may be connected between the second transistor T2 and the third node N3. The third transistor T3 may control connection between the second transistor T2 and the third node N3, corresponding to the first clock signal CLK1 supplied to the second input line 1002.

The third transistor T3 may include a third gate electrode GE3 connected to the second input line 1002 through a second contact electrode CNE2, a third drain electrode DE3 connected to the third node and the 1bth drain electrode DE1b of the first transistor T1, and a third source electrode SE3 connected to the second drain electrode DE2 of the second transistor T2. The second contact electrode CNE2 may be integrally provided with the third gate electrode GE3.

Also, the third transistor T3 may include a third active pattern ACT3 that overlaps with the third gate electrode GE3 and is connected to each of the third source electrode SE3 and the third drain electrode DE3.

The second transistor T2 may be connected between the third transistor T3 and the fourth input line 1004. The second transistor T2 may control connection between the third transistor T3 and the fourth input line 1004, corresponding to the voltage of the first node N1.

The second transistor T2 may include a second gate electrode GE2 connected to the first node N1, a second drain electrode DE2 connected to the third source electrode SE3 of the third transistor T3, and a second source electrode SE2 connected to the fourth input line 1004 through a fourth contact electrode CNE4.

Also, the second transistor T2 may include a second active pattern ACT2 that overlaps with the second gate electrode GE2 and is connected to each of the second source electrode SE2 and the second drain electrode DE2.

The second driving circuit 1220 may control the voltage of the first node N1, corresponding to voltages of the third input line 1003 and the third node N3. To this end, the second driving circuit 1220 may include an eighth transistor T8, a fourth transistor T4, a fifth transistor T5, a first capacitor C1, and a second capacitor C2.

The first capacitor C1 may be connected between the second node N2 and the output terminal 1006. The first capacitor C1 charges a voltages corresponding to turn-on and turn-off of the seventh transistor T7.

The first capacitor C1 may include a lower electrode LE1 connected to the second node N2 and an upper electrode UE1 connected to the output terminal 1006. The lower electrode LE1 of the first capacitor C1 may be electrically connected to an eighth drain electrode DE8 of the eighth transistor T8.

The upper electrode UE1 of the first capacitor C1 overlaps with the lower electrode LE1, and may cover the lower electrode LE1 when viewed on a plane (e.g., in a plan view).

The second capacitor C2 may be connected between the first node N1 and the fourth input line 1004. The second capacitor C2 may charge the voltage applied to the first node N1.

The second capacitor C2 may include a lower electrode LE2 connected to the first node N1 and an upper electrode UE2 connected to the fourth input line 1004. The lower electrode LE2 of the second capacitor C2 may be integrally provided with the second gate electrode GE2 of the second transistor T2. In addition, the lower electrode LE2 of the second capacitor C2 may be integrally provided with the sixth gate electrode GE6 of the sixth transistor T6.

The upper electrode UE2 of the second capacitor C2 overlaps with the lower electrode LE2 of the second capacitor C2, and may cover the lower electrode LE2 of the second capacitor C2 when viewed on a plane (e.g., in a plan view).

The fourth transistor T4 may be connected between the first node N1 and the third input line 1003. The fourth transistor T4 may control connection between the first node N1 and the third input line 1003, corresponding to the voltage of the third node N3.

The fourth transistor T4 may include a fourth gate electrode GE4 connected to the third node N3, a fourth drain electrode DE4 connected to the first node N1, and a fourth source electrode SE4 connected to the third input line 1003.

Also, the fourth transistor T4 may include a fourth active pattern ACT4 that overlaps with the fourth gate electrode GE4 and is connected to each of the fourth source electrode SE4 and the fourth drain electrode DE4.

The fifth transistor T5 may be located between the first node N1 and a fifth input line 1005 to which a gate low voltage VGL is supplied. The fifth transistor T5 may control connection between the first node N1 and the fifth input line 1005, corresponding to the second clock signal CLK2 of the third input line 1003.

The fifth transistor T5 may include a fifth gate electrode GE5 connected to the third input line 1003, a fifth source electrode SE5 connected to the first node N1, and a fifth drain electrode DE5 connected to the fifth input line 1005 through a fifth contact electrode CNE5. The fifth contact electrode CNE5 may be integrally provided with the fifth input line 1005.

Also, the fifth transistor T5 may include a fifth active pattern ACT5 that overlaps with the fifth gate electrode GE5 and is connected to each of the fifth source electrode SE5 and the fifth drain electrode DE5.

The eighth transistor T8 may be connected between the third node N3 and the second node N2. The eighth transistor T8 may maintain electrical connection between the third node N3 and the second node N2 while maintaining a turn-on state. Additionally, the eighth transistor T8 may limit a voltage drop width of the third node N3, corresponding to the voltage of the second node N2.

The eighth transistor T8 may include an eighth gate electrode GE8 connected to the fifth input line 1005, an eighth source electrode SE8 connected to the third node N3, and the eighth drain electrode DE8 connected to the second node N2.

Also, the eighth transistor T8 may include an eighth active pattern ACT8 that overlaps with the eighth gate electrode GE8 and is connected to each of the eighth source electrode SE8 and the eighth drain electrode DE8.

A scan signal output from the (2-1)th scan stage circuit SST1 having the above-described configuration may be transferred to a corresponding scan line S1 through a corresponding scan routing line SR1. Also, the scan signal may be transferred to the (2-2)th scan stage circuit SST2 located at a next stage of the (2-1)th scan stage circuit SST1 through a connecting line CL.

In FIGS. 5 and 6, the (2-1)th scan stage circuit SST1 among the second scan stage circuits included in the scan driver (see SDV of FIG. 1), which are located in the second non-display region NDA2, is mainly described, but the scan stage circuits SST11 to SST17 included in the scan driver SDV, which are located in the first non-display region NDA1, may also have the same circuit configuration.

In addition, the dummy scan circuits DSST1 to DSST6 described above may have the same circuit configuration as the (2-1)th scan stage circuit SST1, or have a circuit configuration in which a partial configuration of the (2-1)th scan stage circuit SST1 is omitted.

Figure 7:
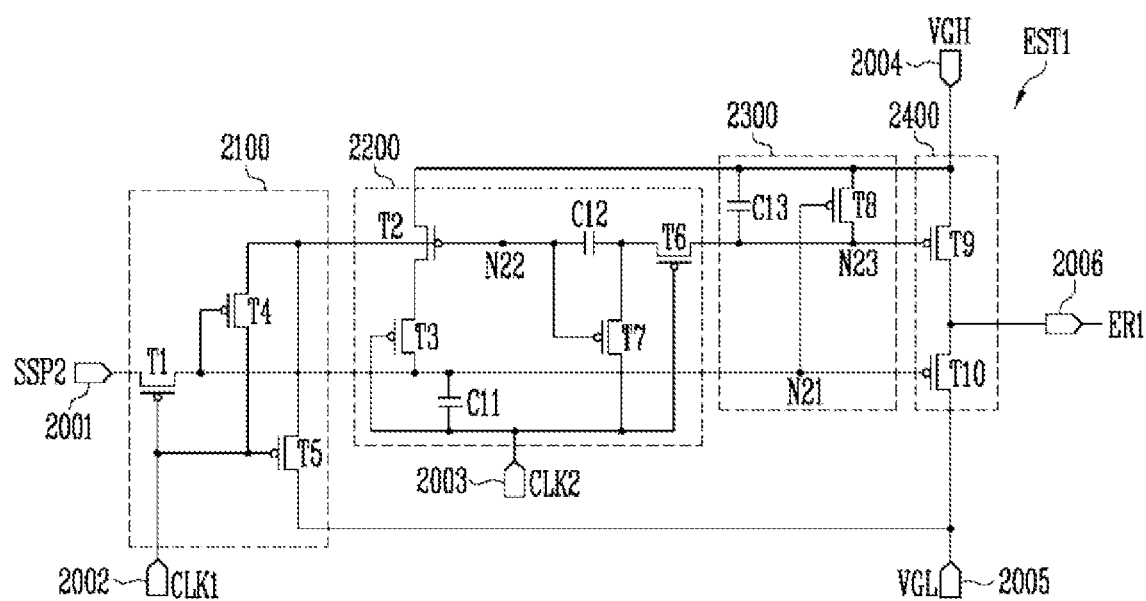
FIG. 7 is a circuit diagram illustrating a (2-1)th emission stage circuit of FIG. 3.
Figure 8:
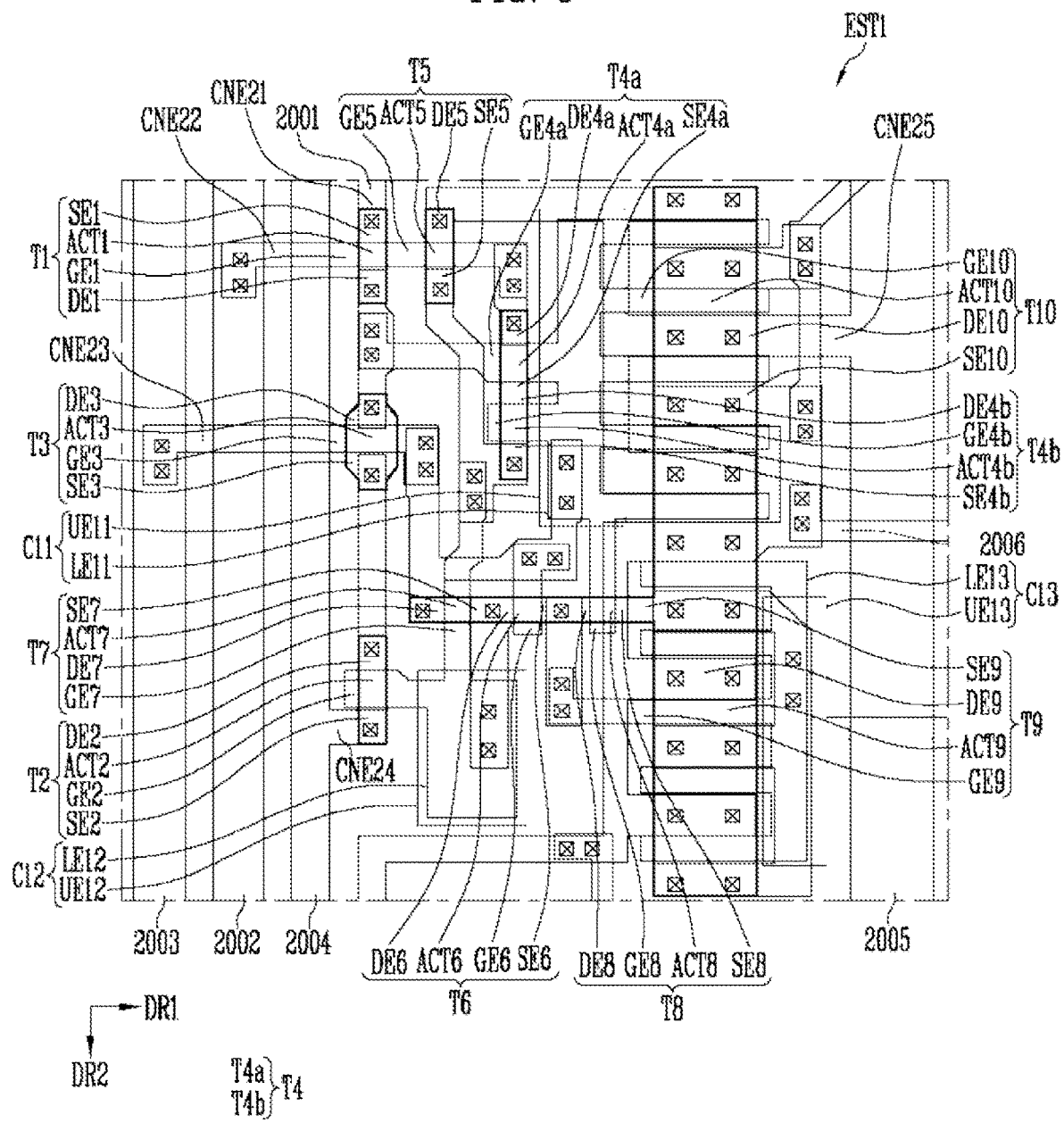
FIG. 8 is a plan view illustrating in detail the (2-1)th emission stage circuit of FIG. 7.

FIG. 7 is a circuit diagram illustrating the (2-1)th emission stage circuit of FIG. 3. FIG. 8 is a plan view illustrating in detail the (2-1)th emission stage circuit of FIG. 7.

Referring to FIGS. 3, 7, and 8, the (2-1)th emission stage circuit EST1 may include a first driving circuit 2100, a second driving circuit 2200, a third driving circuit 2300, and an output unit 2400.

The first driving circuit 2100 may control voltages of a twenty-second node N22 and a twenty-first node N21, corresponding to a start pulse SSP2 supplied to a twenty-first input line 2001 and a first clock signal CLK1 supplied to a twenty-second input line 2002. To this end, the first driving circuit 2100 may include a first transistor T1, a fourth transistor T4, and a fifth transistor T5.

The first transistor T1 may be connected between the twenty-first input line 2001 and the twenty-first node N21. The first transistor T1 may be turned on when the first clock signal CLK1 is supplied to the twenty-second input line 2002.

The first transistor T1 may include a first gate electrode GE1 connected to the twenty-second input line 2002 through a twenty-second contact electrode CNE22, a first source electrode SE1 connected to the twenty-first input line 2001 through a twenty-first contact electrode CNE21, and a first drain electrode DE1 connected to the twenty-first node N21. The twenty-second contact electrode CNE22 may be integrally provided with the first gate electrode GE1.

Also, the first transistor T1 may include a first active pattern ACT1 that overlaps with the first gate electrode GE1 and is connected to each of the first source electrode SE1 and the first drain electrode DE1.

The fourth transistor T4 may be connected between the twenty-second input line 2002 and the twenty-second node N22. The fourth transistor T4 may be turned on or turned off corresponding to the voltage of the twenty-first node N21.

The fourth transistor T4 may be provided in a double gate structure to prevent leakage current. The fourth transistor T4 may include a 4ath transistor T4a and a 4bth transistor T4b.

The 4ath transistor T4a may include a 4ath gate electrode GE4a connected to the twenty-first node N21, a 4ath drain electrode DE4a connected to the twenty-second input line 2002, and a 4ath source electrode SE4a connected to a 4bth drain electrode DE4b of the 4bth transistor T4b.

Also, the 4ath transistor T4a may include a 4ath active pattern ACT4a that overlaps with the 4ath gate electrode GE4a and is connected to each of the 4ath source electrode SE4a and the 4ath drain electrode DE4a.

The 4bth transistor T4b may include a 4bth gate electrode GE4b connected to the twenty-first node N21, the 4bth drain electrode DE4b connected to the 4ath source electrode SE4a of the 4ath transistor T4a, and a 4bth source electrode SE4b connected to a fifth source electrode SE5 of the fifth transistor T5.

Also, the 4bth transistor T4b may include a 4bth active pattern ACT4b that overlaps with the 4bth gate electrode GE4b and is connected to each of the 4bth source electrode SE4b and the 4bth drain electrode DE4b.

The fifth transistor T5 may be connected between a twenty-fifth input line 2005 supplied with a gate low voltage VGL and the twenty-second node N22. The fifth transistor T5 may be turned on when the first clock signal CLK1 is supplied to the twenty-second input line 2002.

The fifth transistor T5 may include a fifth gate electrode GE5 connected to the twenty-second input line 2002, the fifth source electrode SE5 connected to the 4bth source electrode SE4b of the 4bth transistor T4b, and a fifth drain electrode DE5 connected to the twenty-fifth input line 2005.

Also, the fifth transistor T5 may include a fifth active pattern ACT5 connected to each of the fifth source electrode SE5 and the fifth drain electrode DE5.

The second driving circuit 2200 may control voltages of the twenty-first node N21 and a twenty-third node N23, corresponding to a second clock signal CLK2 supplied to a twenty-third input line 2003 and the voltage of the twenty-second node N22. To this end, the second driving circuit 2200 may include a second transistor T2, a third transistor T3, a sixth transistor T6, a seventh transistor T7, an eleventh capacitor C11, and a twelfth capacitor C12.

The third transistor T3 may be connected between the second transistor T2 and the twenty-first node N21. The third transistor T3 may be turned on when the second clock signal CLK2 is supplied to the twenty-third input line 2003.

The third transistor T3 may include a third gate electrode GE3 connected to the twenty-third input line 2003 through a twenty-third contact electrode CNE23, a third drain electrode DE3 connected to the first drain electrode DE1 of the first transistor T1, and a third source electrode SE3 connected to a second drain electrode DE2 of the second transistor T2. The twenty-third contact electrode CNE23 may be integrally provided with the third gate electrode GE3.

Also, the third transistor T3 may include a third active pattern ACT3 that overlaps with the third gate electrode GE3 and is connected to each of the third source electrode SE3 and the third drain electrode DE3.

The second transistor T2 may be connected between a twenty-fourth input line 2004 supplied with a gate high voltage VGH and the third transistor T3. The second transistor T2 may be turned on or turned off corresponding to the voltage of the twenty-second node N22.

The second transistor T2 may include a second gate electrode GE2 connected to the twenty-second node N22, the second drain electrode DE2 connected to the third source electrode SE3 of the third transistor T3, and a second source electrode SE2 connected to the twenty-fourth input line 2004 through a twenty-fourth contact electrode CNE24. The twenty-fourth contact electrode CNE24 may be integrally provided with the twenty-fourth input line 2004.

Also, the second transistor T2 may include a second active pattern ACT2 that overlaps with the second gate electrode GE2 and is connected to each of the second source electrode SE2 and the second drain electrode DE2.

The seventh transistor T7 may be connected between a sixth drain electrode DE6 of the sixth transistor T6 and the twenty-third input line 2003. The seventh transistor T7 may be turned on or turned off corresponding to the voltage of the twenty-second node N22.

The seventh transistor T7 may include a seventh gate electrode GE7 connected to the twenty-second node N22, a seventh source electrode SE7 connected to the sixth drain electrode DE6 of the sixth transistor T6, and a seventh drain electrode DE7 connected to the twenty-third input line 2003.

Also, the seventh transistor T7 may include a seventh active pattern ACT7 that overlaps with the seventh gate electrode GE7 and is connected to each of the seventh source electrode SE7 and the seventh drain electrode DE7.

The sixth transistor T6 may be connected between the seventh source electrode SE7 of the seventh transistor T7 and the twenty-third node N23. The sixth transistor T6 may be turned on when the second clock signal CLK2 is supplied to the twenty-third input line 2003.

The sixth transistor T6 may include a sixth gate electrode GE6 connected to the twenty-third input line 2003, the sixth drain electrode DE6 connected to the seventh source electrode SE7 of the seventh transistor T7, and a sixth source electrode SE6 connected to the twenty-third node N23.

Also, the sixth transistor T6 may include a sixth active pattern ACT6 that overlaps with the sixth gate electrode GE6 and is connected to each of the sixth source electrode SE6 and the sixth drain electrode DE6.

The eleventh capacitor C11 may be connected between the twenty-first node N21 and the twenty-third input line 2003.

The eleventh capacitor C11 may include a lower electrode LE11 connected to the twenty-first node N21 and an upper electrode UE11 connected to the twenty-third node N23. The lower electrode LE11 of the eleventh capacitor C11 may be configured as a tenth gate electrode GE10 of a tenth transistor T10. The upper electrode UE11 of the eleventh capacitor C11 overlaps with the lower electrode L11 of the eleventh capacitor C11, and may cover the lower electrode L11 of the eleventh capacitor C11 when viewed on a plane (e.g., in a plan view).

The twelfth capacitor C12 may be connected between the twenty-second node N22 and the sixth drain electrode DE6 of the sixth transistor T6.

The twelfth capacitor C12 may include a lower electrode LE12 connected to the twenty-second node N22 and an upper electrode UE12 connected to the sixth drain electrode DE6 of the sixth transistor T6. The lower electrode LE12 of the twelfth capacitor C12 may be configured as the seventh gate electrode GE7 of the seventh transistor T7. The upper electrode UE12 of the twelfth capacitor C12 overlaps with the lower electrode LE12 of the twelfth capacitor C12, and may cover the lower electrode LE12 of the twelfth capacitor C12 when viewed on a plane (e.g., in a plan view).

The third driving circuit 2300 may control a voltage of the twenty-third node N23 corresponding to the voltage of the twenty-first node N21. To this end, the third driving circuit 2300 may include an eighth transistor T8 and a thirteenth capacitor C13.

The eighth transistor T8 may be connected between the twenty-fourth input line 2004 supplied with the gate high voltage VGH and the twenty-third node N23. The eighth transistor T8 may be turned on or turned off corresponding to the voltage of the twenty-first node N21.

The eighth transistor T8 may include an eighth gate electrode GE8 connected to the twenty-first node N21, an eighth source electrode SE8 connected to the twenty-fourth input line 2004, and an eighth drain electrode DE8 connected to the twenty-third node N23.

Also, the eighth transistor T8 may include an eighth active pattern ACT8 that overlaps with the eighth gate electrode GE8 and is connected to each of the eighth source electrode SE8 and the eighth drain electrode DE8.

The thirteenth capacitor C13 may be connected between the twenty-fourth input line 2004 supplied with the gate high voltage VGH and the twenty-third node N23.

The thirteenth capacitor C13 may include an upper electrode UE13 connected to the twenty-fourth input line 2004 and a lower electrode LE13 connected to the twenty-third node N23. The lower electrode LE13 of the thirteenth capacitor 13 may be configured as a ninth gate electrode GE9 of a ninth transistor T9. The upper electrode UE13 of the thirteenth capacitor C13 overlaps with the lower electrode LE13 of the thirteenth capacitor C13, and may cover the lower electrode LE13 of the thirteenth capacitor C13 when viewed on a plane (e.g., in a plan view).

The output unit 2400 may control a voltage supplied to an output terminal 2006, corresponding to the voltages of the twenty-first node N21 and the twenty-third node N23. To this end, the output unit 2400 may include the ninth transistor T9 and the tenth transistor T10.

The ninth transistor T9 may be connected between the twenty-fourth input line 2004 supplied with the gate high voltage VGH and the output terminal 2006. The ninth transistor T9 may be turned on or turned off corresponding to the voltage of the twenty-third node N23.

The ninth transistor T9 may include the ninth gate electrode GE9 connected to the twenty-third node N23, a ninth source electrode SE9 connected to the twenty-fourth input line 2004, and a ninth drain electrode DE9 connected to the output terminal 2006.

Also, the ninth transistor T9 may include a ninth active pattern ACT9 that overlaps with the ninth gate electrode GE9 and is connected to each of the ninth source electrode SE9 and the ninth drain electrode DE9.

The tenth transistor T10 may be located between the output terminal 2006 and the twenty-fifth input line 2005 supplied with the gate low voltage VGL. The tenth transistor T10 may be turned on or turned off corresponding to the voltage of the twenty-first node N21.

The tenth transistor T10 may include the tenth gate electrode GE10 connected to the twenty-first node N21, a tenth source electrode SE10 connected to the output terminal 2006, and a tenth drain electrode DE10 connected to the twenty-fifth input line 2005 through a twenty-fifth contact electrode CNE25. The twenty-fifth contact electrode CNE25 may be integrally provided with the twenty-fifth input line 2005.

Also, the tenth transistor T10 may include a tenth active pattern ACT10 that overlaps with the tenth gate electrode GE10 and is connected to each of the tenth source electrode SE10 and the tenth drain electrode DE10.

In some example embodiments of the present disclosure, the ninth transistor T9 and the tenth transistor T10 may be configured as a plurality of transistors connected in parallel to each other as shown in FIG. 8.

The output unit 2400 having the above-described configuration may be driven as a buffer.

An emission control signal output from the (2-1)th emission scan stage circuit EST1 having the above-described configuration may be transferred to a corresponding second pixel PXL2 through a corresponding emission routing line ER1. Also, the emission control signal may be transferred to the first dummy emission stage circuit DEST1 through the first emission bridge line EBR1.

In FIGS. 7 and 8, the (2-1)th emission stage circuit EST1 among the second emission stage circuits included in the emission driver (see EDV of FIG. 1), which are located in the second non-display region NDA2, is mainly described, but the emission stage circuits EST6 to EST9 included in the emission driver EDV, which are located in the first non-display region NDA1, may also have the same configuration.

In addition, the dummy emission circuits DEST1 to DEST3 described above may have the same circuit configuration as the (2-1)th emission stage circuit EST1, or have a circuit configuration in which a partial configuration of the (2-1)th emission stage circuit EST1 is omitted.

Figure 9:
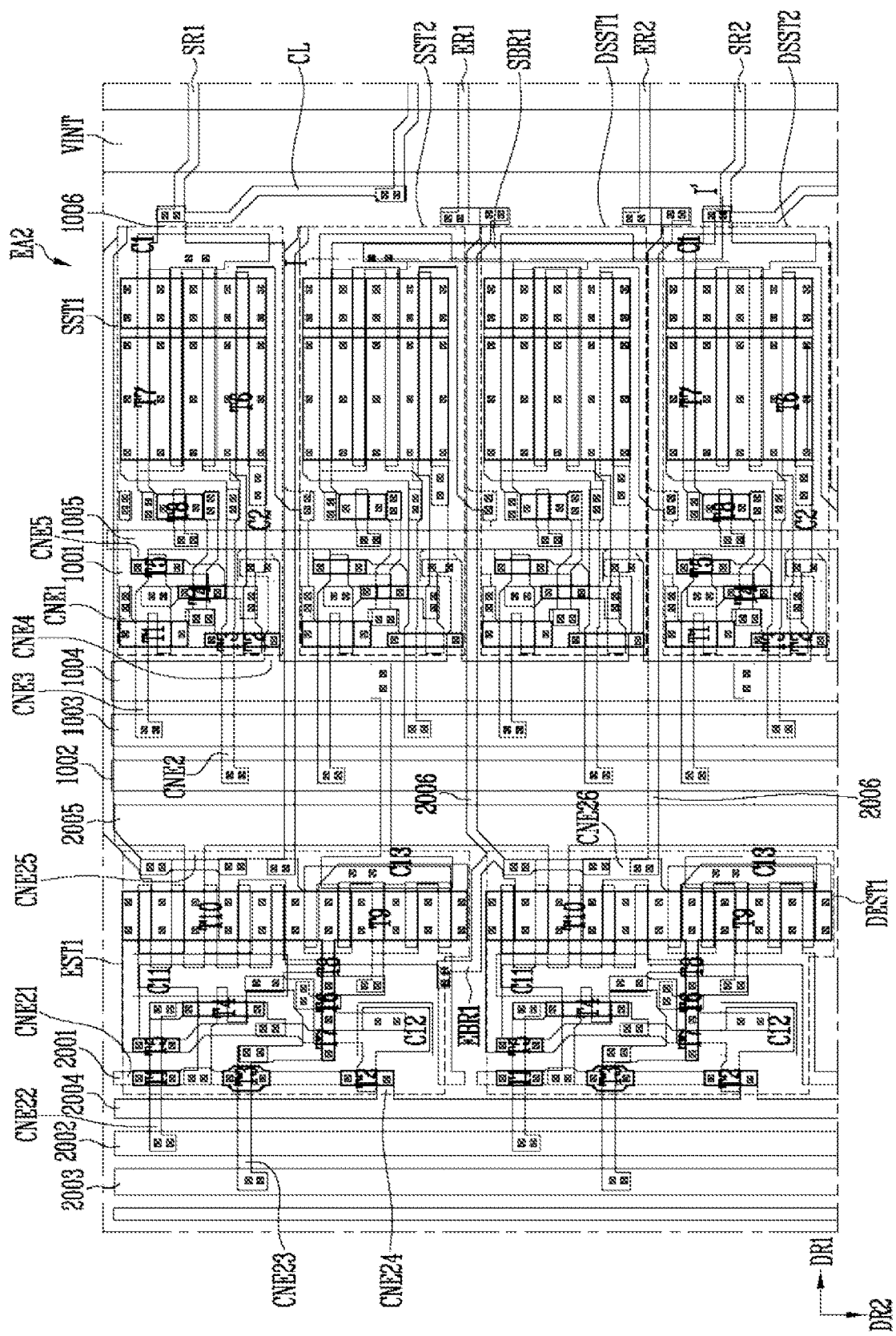
FIG. 9 is an enlarged plan view of portion EA2 of FIG. 3.
Figure 10:
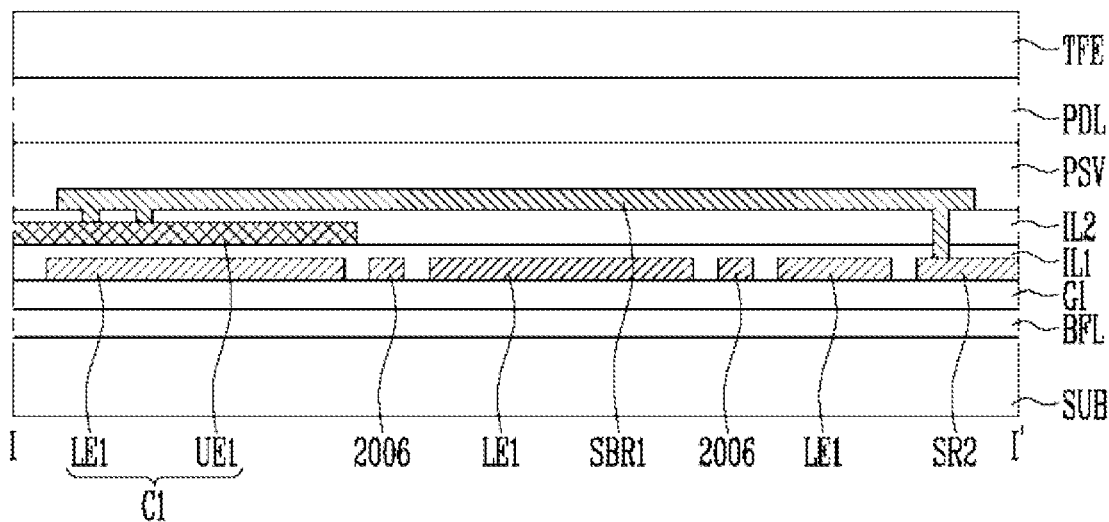
FIG. 10 is a sectional view taken along line I-I' of FIG. 9.
Figure 11:
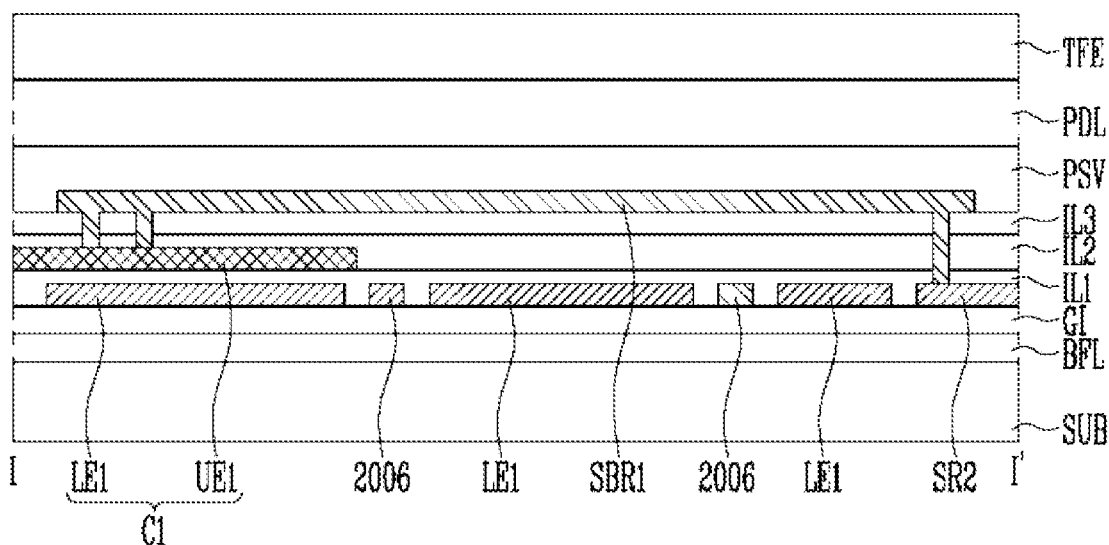
FIG. 11 illustrates another form of a scan bridge line of FIG. 10, which is a sectional view corresponding to the line I-I' of FIG. 9.
Figure 12:
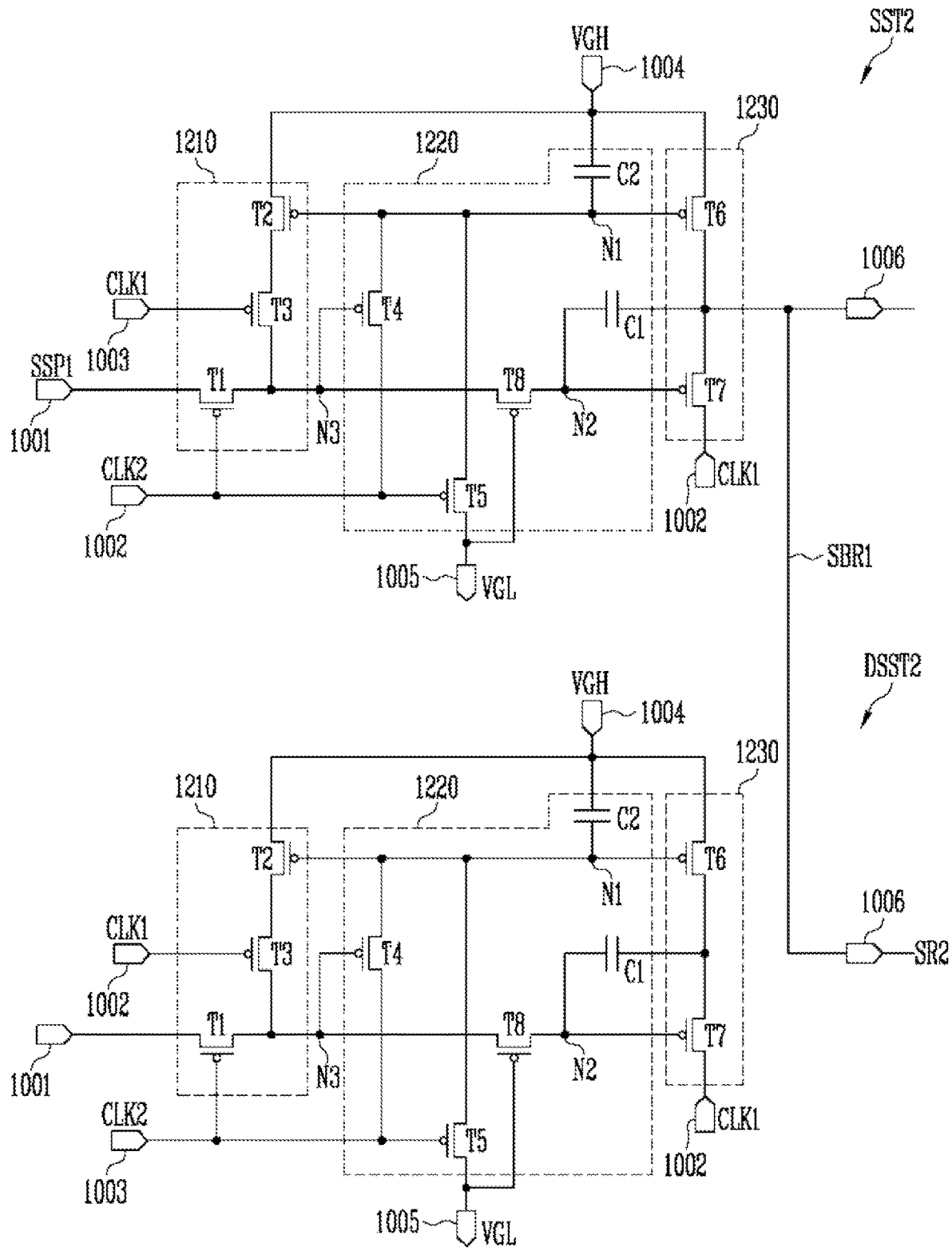
FIG. 12 is a diagram illustrating a connection relationship between a (2-2)th scan stage circuit and a second dummy scan stage circuit, which are shown in FIG. 9.
Figure 13:
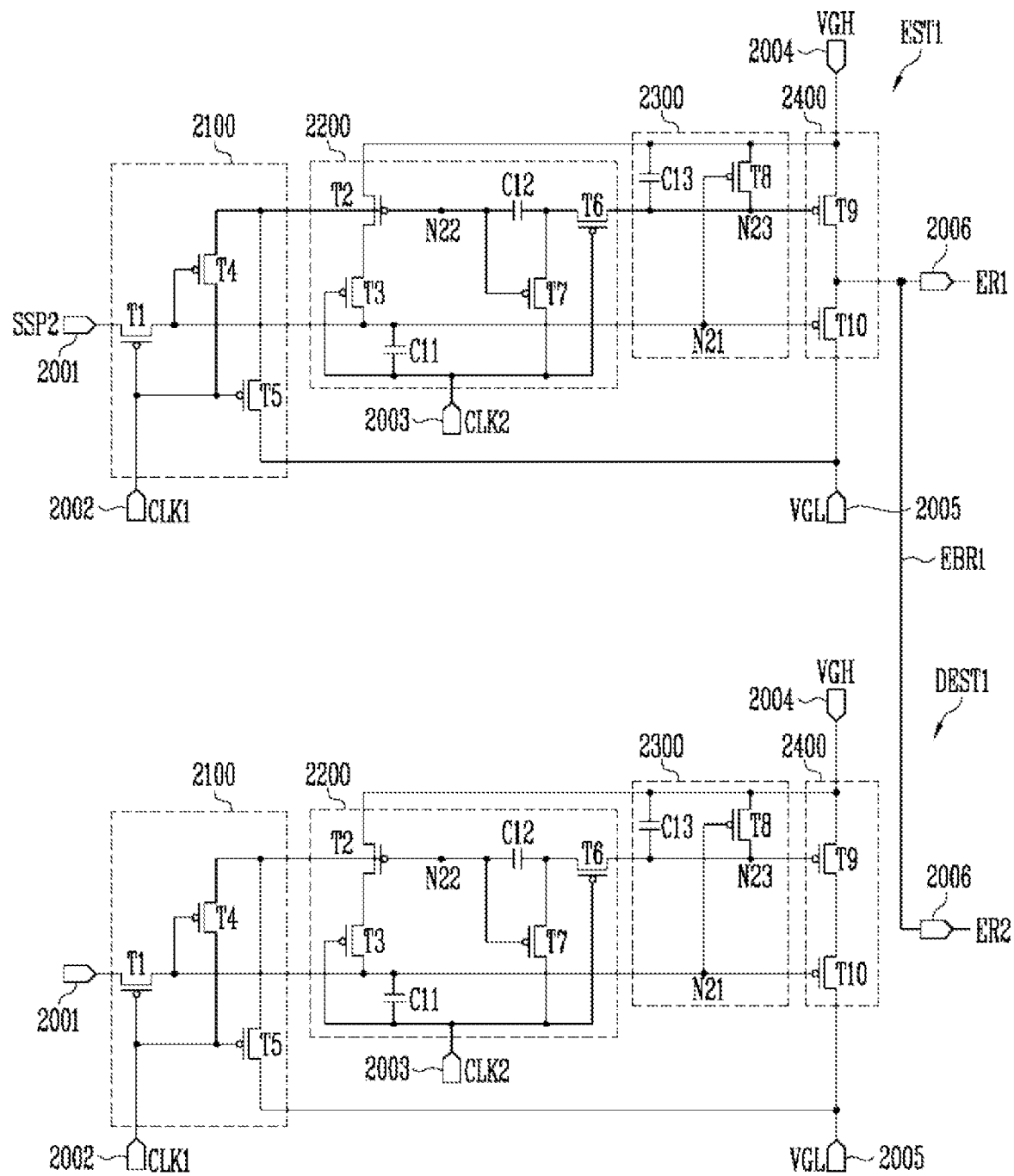
FIG. 13 is a diagram illustrating a connection relationship between the (2-1)th emission stage circuit and a first dummy emission stage circuit, which are shown in FIG. 9.

FIG. 9 is an enlarged plan view of portion EA2 of FIG. 3. FIG. 10 is a sectional view taken along line I-I' of FIG. 9. FIG. 11 illustrates another form of a scan bridge line of FIG. 10, which is a sectional view corresponding to the line I-I' of FIG. 9. FIG. 12 is a diagram illustrating a connection relationship between a (2-2)th scan stage circuit and a second dummy scan stage circuit, which are shown in FIG. 9. FIG. 13 is a diagram illustrating a connection relationship between the (2-1)th emission stage circuit and a first dummy emission stage circuit, which are shown in FIG. 9.

In FIG. 9, two second scan stage circuits SST1 and SST2 adjacent to each other, two dummy scan stage circuits DSST1 and DSST2 adjacent to each other, a second emission stage circuit EST1, and a dummy emission stage circuit DEST1 are mainly illustrated for convenience of description. Also, in FIG. 9, a line unit connected to each stage circuit is mainly illustrated.

In FIG. 9, portions different from those of the above-described embodiment will be mainly described to avoid redundancy. Portions not particularly described in FIG. 9 follow those of the above-described embodiment. In addition, identical reference numerals refer to identical components, and similar reference numerals refer to similar components.

Referring to FIGS. 1 to 13, a (2-1)th scan stage circuit SST1, a (2-2)th scan stage circuit SST2, first and second dummy scan stage circuits DSST1 and DSST2, a (2-1)th emission stage circuit EST1, and a first dummy emission stage circuit DEST1 may be located in a second non-display region NDA2.

The (2-1)th scan stage circuit SST1 is connected to one end of a corresponding first scan routing line SR1. Therefore, the (2-1)th scan stage circuit SST1 may supply a first scan signal to corresponding second pixels PXL2.

In addition, the first scan signal may be supplied to second pixels PXL2 located on the next row of the corresponding second pixels PXL2 through a connecting line CL.

The (2-1)th scan stage circuit SST1 may be operated corresponding to clock signals CLK1 and CLK2 supplied from the timing controller (see TC of FIG. 2). Also, the (2-1)th scan stage circuit SST1 may be supplied with a start pulse SSP1 for scan stage (hereinafter, referred to as a 'first start pulse').

The (2-1)th scan stage circuit SST1 may include first to eighth transistors T1 to T8, a first capacitor C1, a second capacitor C2, and an output terminal 1006. Also, the (2-1)th scan stage circuit SST1 may be connected to first to fifth input lines 1001 to 1005.

The first start pulse SSP1 may be supplied to the first input line 1001, a first clock signal CLK1 for scan stage may be supplied to the second input line 1002, and a second clock signal CLK2 for scan stage may be supplied to the third input line 1003.

A gate high voltage VGH for scan stage may be supplied to the fourth input line 1004, and a gate low voltage VGL for scan stage may be supplied to the fifth input line 1005.

The first clock signal CLK1 for scan stage and the second clock signal CLK2 for scan stage may have different phases. For example, the second clock signal CLK2 for scan stage may have a phase difference of 180 degrees with the first clock signal CLK1 for scan stage.

The (2-2)th scan stage circuit SST2 may have the same configuration as the (2-1)th scan stage circuit SST1, except that a first transistor T1 is connected to the second input line 1002, a third transistor T3 is connected to the third input line 1003, and a first contact electrode CNE1 is connected to an output terminal of a previous scan stage circuit and a first scan bridge line SBR1.

The (2-2)th scan stage circuit SST2 may be supplied with the first scan signal from the output terminal 1006 of the (2-1)th scan stage circuit SST1.

For example, the (2-2)th scan stage circuit SST2 may be supplied with the first scan signal through the first contact electrode CNE1 connected to the output terminal 1006 of the (2-1)th scan stage circuit SST1.

The (2-2)th scan stage circuit SST2 may be supplied with the first scan signal as a start pulse, and generate a second scan signal.

In some example embodiments of the present disclosure, one side of the first scan bridge line SBR1 may be connected to an output unit 1230 of the (2-2)th scan stage circuit SST2. For example, the one side of the first scan bridge line SBR1 may be connected between sixth and seventh transistors T6 and T7 of the (2-2)th scan stage circuit SST2.

The other side of the first scan bridge line SBR1 may be connected to an output terminal 1006 (hereinafter, referred to as a 'second dummy output terminal') of the second dummy scan stage circuit DSST2.

Therefore, the (2-2)th scan stage circuit SST2 may be electrically connected to the second dummy scan stage circuit DSST2 through the first scan bridge line SBR1.

The second scan signal may be transferred to the second dummy output terminal 1006 through the first scan bridge line SBR1. The second dummy output terminal 1006 may be connected to a second scan routing line SR2 to provide the second scan signal to a corresponding second pixel PXL2.

The second dummy scan stage circuit DSST2 may have the same configuration as the (2-2)th scan stage circuit SST2, except that the first contact electrode CNE1 is not connected to an output terminal of a previous scan stage circuit (i.e., the first dummy scan stage circuit DSST1), and an upper electrode UE1 of the first capacitor C1 is omitted.

When viewed on a plane (e.g., in a plan view), the first scan bridge line SBR1 may extend along the length direction of a substrate SUB in the second non-display region NDA2, e.g., a second direction DR2.

The first scan bridge line SBR1 may overlap with each of a portion of the (2-2)th scan stage circuit SST2, a portion of the first dummy scan stage circuit DSST1, and a portion of the second dummy scan stage circuit DSST2.

The second dummy scan stage circuit DSST2 may be in a floating state. The second dummy scan stage circuit DSST2 may transfer the second scan signal a second pixel PXL2 corresponding to the second scan routing line SR2 through the first scan bridge line SBR1.

The (2-1)th emission stage circuit EST1 is connected to one end of a corresponding first emission routing line ER1. Therefore, the (2-1)th emission stage circuit EST1 may supply a first emission control signal to a corresponding second pixel PXL2.

The (2-1)th emission stage circuit EST1 may be operated corresponding to clock signals CLK1 and CLK2 supplied from the timing controller TC. Also, the (2-1)th emission stage circuit EST1 may be supplied with a start pulse SSP2 for emission stage (hereinafter, referred to as a 'second start pulse').

The (2-1)th emission stage circuit EST1 may include first to tenth transistors T1 to T10, eleventh to thirteenth capacitors C11 to C13, and an output terminal 2006. Also, the (2-1)th emission stage circuit EST1 may be connected to twenty-first to twenty-fifth input lines 2001 to 2005.

The second start pulse SSP2 may be supplied to the twenty-first input line 2001, a first clock signal CLK1 for emission stage may be supplied to the twenty-second input line 2002, and a second clock signal CLK2 for emission stage may be supplied to the twenty-third input line 2003.

A gate high voltage VGH for emission stage may be supplied to the twenty-fourth input line 2004, and a gate low voltage VGL for emission stage may be supplied to the twenty-fifth input line 2005.

The gate high voltage VGH for emission stage may have the same voltage as the gate high voltage VGH for scan stage, and the gate low voltage VGL for emission stage may have the same voltage as the gate low voltage VGL for scan stage.

The first clock signal CLK1 for emission stage and the second clock signal CLK2 for emission stage may have different phases.

The first dummy emission stage circuit DEST1 may have the same configuration as the (2-1)th emission stage circuit EST1, except that the first dummy emission stage circuit DEST1 has an output terminal 2006 connected to a first emission bridge line EBR1 and includes a twenty-sixth contact electrode CNE26 connected to the first emission bridge line EBR1, and a twenty-first electrode CNE21 is not connected to an output terminal of a previous emission stage circuit. The previous emission stage circuit may be the (2-1)th emission stage circuit EST1.

The first dummy emission stage circuit DEST1 may be connected to the output terminal 2006 of the (2-1)th emission stage circuit EST1 through the first emission bridge line EBR1.

The first emission bridge line EBR1 may be integrally provided with the output terminal 2006 of the (2-1)th emission stage circuit EST1. Also, the first emission bridge line EBR1 may be connected to the output terminal 2006 of the first dummy emission stage circuit DEST1 through the twenty-sixth contact electrode CNE26.

Therefore, the (2-1)th emission stage circuit EST1 may be electrically connected to the output terminal 2006 of the first dummy emission stage circuit DEST1 through the first emission bridge line EBR1.

Thus, the first emission control signal of the (2-1)th emission stage circuit EST1 is transferred to the output terminal 2006 of the first dummy emission stage circuit DEST1 through the first emission bridge line EBR1.

The output terminal 2006 of the first dummy emission stage circuit DEST1 may be connected to a second emission routing line ER2. Therefore, the first emission control signal transferred to the output terminal 2006 of the first dummy emission stage circuit DEST1 may be transferred to a second pixel PXL2 corresponding to the second emission routing line ER2.

The first emission control signal connected to the pixel PXL2 corresponding to the second emission routing line ER2 may be a second emission control signal synchronized with the second scan signal.

When viewed on a plane (e.g., in a plan view), the first emission bridge line EBR1 may be located in a shape extending in a first direction DR1 intersecting the second direction DR2 in the second non-display region NDA2, but the present disclosure is not limited thereto.

The first dummy emission stage circuit DEST1 may be in a floating state. The first dummy emission stage circuit DEST1 may transfer the second emission control signal to a second pixel PXL2 corresponding to the second emission routing line ER2 through the first emission bridge line EBR1.

Hereinafter, a stack structure of the first scan bridge line SBR1 and the first emission bridge line EBR1 will be described with reference to FIG. 10.

A buffer layer BFL and a gate insulating layer GI may be sequentially located on the substrate SUB.

The buffer layer BFL may prevent an impurity from being diffused into the transistors T1 to T8 included in the (2-1)th and (2-2)th scan stage circuits SST1 and SST2 and the transistors T1 to T10 included in the (2-1)th emission stage circuit EST1. The buffer layer BFL may be provided in a single layer, but be provided in a multi-layer including at least two layers. When the buffer layer BFL is provided in the multi-layer, the layers may be formed of the same material or be formed of different materials. The buffer layer BFL may be omitted according to the material and process conditions of the substrate SUB.

The gate insulating layer GI may be an inorganic insulating layer including an inorganic material. For example, the gate insulating layer GI may include at least one of silicon nitride, silicon oxide, and silicon oxynitride.

The lower electrode LE1 of the first capacitor C1, the output terminal 2006 of the (2-1)th emission stage circuit EST1, the output terminal 2006 of the first dummy emission stage circuit DEST1, and the second scan routing line SR2 may be provided on the gate insulating layer GI.

Although not shown in FIG. 10, the first emission bridge line EBR1 may be integrally provided with the output terminal 2006 of the (2-1)th emission stage circuit EST1, and be provided in the same layer as the output terminal 2006 of the (2-1)th emission stage circuit EST1.

A first insulating layer IL1 may be located on the substrate SUB on which the lower electrode LE1 of the first capacitor C1 and the like are formed. The first insulating layer IL1 may include the same material as the gate insulating layer GI.

The upper electrode UE1 of the first capacitor C1 may be located on the first insulating layer IL1. The upper electrode UE1 of the first capacitor C1 may cover the lower electrode LE1 of the first capacitor C1.

A second insulating layer IL2 may be provided over the upper electrode UE1 of the first capacitor C1.

The first scan bridge line SBR1 may be located on the second insulating layer IL2.

The first scan bridge line SBR1 may be connected to the upper electrode UE1 of the first capacitor C1 through a contact hole penetrating the second insulating layer IL2. Also, the first scan bridge line SBR1 may be connected to the second scan routing line SR2 through a contact hole sequentially penetrating the first insulating layer IL1 and the second insulating layer IL2.

In some embodiments, as shown in FIG. 11, a third insulating layer IL3 may be additionally located between the first scan bridge line SBR1 and the upper electrode UE1 of the first capacitor C1.

The first scan bridge line SBR1 may be connected to the upper electrode UE1 of the first capacitor C1 through a contact hole sequentially penetrating the second insulating layer IL2 and the third insulating layer IL3. Also, the first scan bridge line SBR1 may be connected to the second scan routing line SR2 through a contact hole sequentially penetrating the first to third insulating layers IL1 to IL3.

The third insulating layer IL3 may be an inorganic insulating layer including an inorganic material or an organic insulating layer including an organic material. The third insulating layer IL3 may be an organic insulating layer. The third insulating layer IL3 may be provided in a single layer as shown in the drawing. However, the present disclosure is not limited thereto, and the third insulating layer IL3 may be provided in a multi-layer. When the third insulating layer IL3 is provided in the multi-layer, the third insulating layer IL3 may have a structure in which a plurality of inorganic insulating layers and a plurality of organic insulating layers are alternately stacked. For example, the third insulating layer IL3 may have a structure in which a first organic insulating layer, an inorganic insulating layer, and a second organic insulating layer are sequentially stacked.

A protective layer PSV may be provided over the first scan bridge line SBR1.

The protective layer PSV may include at least one of an inorganic insulating layer made of an inorganic material and an organic insulating layer made of an organic material. For example, the protective layer PSV may include the inorganic insulating layer and the organic insulating layer located on the inorganic insulating layer.

A pixel defining layer PDL may be located on the protective layer PSV.

The pixel defining layer PDL may include an organic insulating material. For example, the pixel defining layer PDL may include at least one of polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

A thin film encapsulation layer TFE may be located on the pixel defining layer. The thin film encapsulation layer TFE may prevent oxygen and moisture from penetrating into a light emitting device (not shown) included in each of the second pixels PXL2.

The thin film encapsulation layer TFE may be provided in a single layer, but be provided in a multi-layer. The thin film encapsulation layer TFE may include a plurality of insulating layers covering the light emitting device.

For example, the thin film encapsulation layer TFE may include a plurality of inorganic layers and a plurality of organic layers. For example, the thin film encapsulation layer TFE may have a structure in which the inorganic layers and the organic layers are alternately stacked. Also, in some cases, the thin film encapsulation layer TFE may be an encapsulating substrate that is located over the light emitting device and is joined together with the substrate SUB through a sealant.

Figure 14:
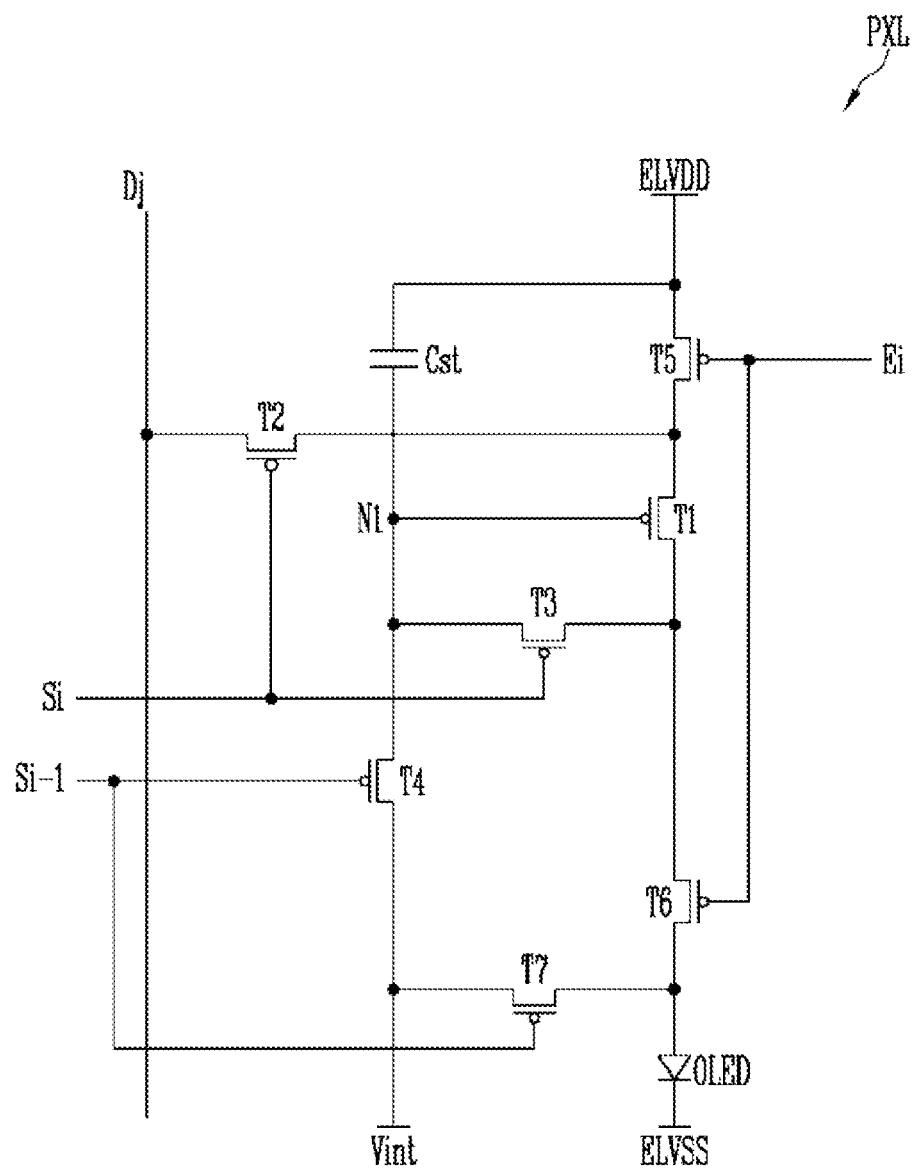
FIG. 14 is an equivalent circuit diagram illustrating one pixel shown in FIG. 1.

FIG. 14 is an equivalent circuit diagram illustrating one pixel shown in FIG. 1. For convenience of description, one pixel connected to a jth data line Dj, an ith emission control line Ei, an ith scan line Si, and an (i−1)th scan line Si−1 is illustrated in FIG. 14.

Referring to FIGS. 1 and 14, the pixel PXL according to the embodiment of the present disclosure may include a light emitting device OLED, first to seventh transistors T1 to T7, and a storage capacitor Cst.

An anode electrode of the light emitting device OLED is connected to the first transistor T1 via the sixth transistor T6, and a cathode electrode of the light emitting device OLED is connected to a second pixel power source ELVSS. The light emitting device OLED may generate light with a predetermined luminance corresponding to an amount of current supplied from the first transistor T1.

A first pixel power source ELVDD may be set to a voltage higher than that of the second pixel power source ELVSS such that a current can flow through the light emitting device OLED.

A source electrode of the first transistor (driving transistor) T1 is connected to the first power source ELVDD via the fifth transistor T5, and a drain electrode of the first transistor T1 is connected to the anode electrode of the light emitting device OLED via the sixth transistor T6. The first transistor T1 controls an amount of current flowing from the first pixel power source ELVDD to the second pixel power source ELVSS via the light emitting device OLED, corresponding to a voltage of a first node N1 that is a gate electrode thereof.

The second transistor (switching transistor) T2 is connected between a jth data line Dj and the source electrode of the first transistor T1. In addition, a gate electrode of the second transistor T2 is connected to an ith scan line Si. The second transistor T2 is turned on when a scan signal is supplied to the ith scan line Si, to electrically connect the jth data line Dj and the source electrode of the first transistor T1.

The third transistor T3 is connected between the drain electrode of the first transistor T1 and the first node N1. In addition, a gate electrode of the third transistor T3 is connected to the ith scan line Si. The third transistor T3 is turned on when a scan signal is supplied to the ith scan line Si, to electrically connect the drain electrode of the first transistor T1 and the first node N1. Thus, the first transistor T1 is diode-connected when the third transistor T3 is turned on.

The fourth transistor T4 is connected between the first node N1 and an initialization power source Vint. In addition, a gate electrode of the fourth transistor T4 is connected to an (i−1)th scan line Si−1. The fourth transistor T4 is turned on when a scan signal is supplied to the (i−1)th scan line Si−1, to supply the voltage of the initialization power source Vint to the first node N1. The initialization power source is set to a voltage lower than that of a data signal.

The fifth transistor T5 is connected between the first pixel power source ELVDD and the source electrode of the first transistor T1. In addition, a gate electrode of the fifth transistor T5 is connected to an ith emission control line Ei. The fifth transistor T5 is turned off when an emission control signal is supplied to the ith emission control line Ei, and is turned on otherwise.

The sixth transistor T6 is connected between the drain electrode of the first transistor T1 and the anode electrode of the organic light emitting device OLED. In addition, a gate electrode of the sixth transistor T6 is connected to the ith emission control line Ei. The sixth transistor T6 is turned off when an emission control signal is supplied to the ith emission control line Ei, and is turned on otherwise.

The seventh transistor T7 is connected between the initialization power source Vint and the anode electrode of the light emitting device OLED, i.e., between the initialization power source Vint and a second node. In addition, a gate electrode of the seventh transistor T7 is connected to the (i−1)th scan line Si−1. The seventh transistor T7 is turned on when a scan signal is supplied to the (i−1)th scan line Si−1, to supply the voltage of the initialization power source Vint to the anode electrode of the light emitting device OLED.

The storage capacitor Cst is connected between the first pixel power source ELVDD and the first node N1. The storage capacitor Cst stores a voltage corresponding to the data signal and a threshold voltage of the first transistor T1.

The pixel structure described in FIG. 14 merely corresponds to an example using a scan line and an emission control line, and therefore, the pixel PXL of the present disclosure is not limited to the pixel structure. Actually, the pixel PXL has a pixel structure capable of supplying a current to the light emitting device OLED, and the pixel structure may be selected as any one of various structures currently known in the art.

In some example embodiments of the present disclosure, the light emitting device OLED may generate various lights including red, green, and blue, corresponding to the amount of current supplied from the first transistor (driving transistor) T1, but the present disclosure is not limited thereto. In an example, the light emitting device OLED may generate white light, corresponding to the amount of current supplied from the first transistor (driving transistor) T1. Therefore, the display device may implement a color image, using a separate color filter, etc.

Additionally, for convenience of description, it is illustrated that the first to seventh transistors T1 to T7 are implemented with a P-type transistor, but the present disclosure is not limited thereto. In other words, the first to seventh transistors T1 to T7 may be implemented with an N-type transistor.

In addition, gate-off and gate-on voltages of each transistor may be set as voltages having different levels depending on a type of each transistor. For example, in the case of a P-type transistor, the gate-off voltage and the gate-on voltage may be set as a high-level voltage and a low-level voltage, respectively. In the case of an N-type transistor, the gate-off voltage and the gate-on voltage may be set as a low-level voltage and a high-level voltage, respectively.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to some example embodiments of the present disclosure, there can be provided a display device that may be capable of efficiently using a dead space.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:
1. A display device comprising:
a substrate including first and second display regions and first and second non-display regions;
a plurality of first pixels in the first display region;
a plurality of second pixels in the second display region;
a plurality of first scan stage circuits in the first non-display region, the first scan stage circuits configured to provide a scan signal to the first pixels;

a plurality of second scan stage circuits in the second non-display region, the second scan stage circuits configured to provide a scan signal to the second pixels;

a plurality of dummy scan stage circuits in the second non-display region, the dummy scan stage circuits being between the second scan stage circuits; and a scan bridge line in the second non-display region, the scan bridge line connecting one second scan stage circuit among the second scan stage circuits and a dummy scan stage circuit adjacent thereto.

2. The display device of claim 1, wherein the dummy scan stage circuits are in a floating state.

3. The display device of claim 2, wherein a first side of the scan bridge line is connected to the one second scan stage circuit, and a second side of the scan bridge line is connected to a dummy scan stage circuit from among the plurality of dummy scan stage circuits.

4. The display device of claim 3, wherein an output terminal of the dummy scan stage circuit is electrically connected to a second pixel corresponding to the one second scan stage circuit.

5. The display device of claim 4, wherein the dummy scan stage circuit is closer to the corresponding second pixel than the one second scan stage circuit.

6. The display device of claim 5, wherein the scan bridge line is configured to transfer a scan signal of the one second scan stage circuit to a second pixel corresponding to the one second scan stage circuit through the output terminal of the dummy scan stage circuit.

7. The display device of claim 6, wherein, in a plan view, the scan bridge line extends in a length direction of the substrate, and overlaps with a portion of the one second scan stage circuit and a portion of the dummy scan stage circuit.

8. The display device of claim 7, wherein the one second scan stage circuit includes at least one transistor and lines connected to the transistor.

9. The display device of claim 8, wherein the scan bridge line is integrally provided with the output terminal of the dummy scan stage circuit.

10. The display device of claim 1, wherein a distance between the second scan stage circuits is larger than a distance between the first scan stage circuits.

11. The display device of claim 10, wherein the second display region is connected to the first display region, and has a width smaller than a width of the first display region.

12. The display device of claim 1, further comprising:
a plurality of first emission stage circuits in the first non-display region, the first emission stage circuits configured to supply an emission control signal to the first pixels;
a plurality of second emission stage circuits in the second non-display region, the second emission stage circuits configured to supply an emission control signal to the second pixels;
a plurality of dummy emission stage circuits in the second non-display region, the dummy emission stage circuits being between the second emission stage circuits; and
an emission bridge line in the second non-display region, the emission bridge line connecting one second emission stage circuit among the second emission stage circuits and a dummy emission stage circuit adjacent thereto.

13. The display device of claim 12, wherein the dummy emission stage circuits are in a floating state.

14. The display device of claim 13, wherein a first side of the emission bridge line is connected to the one second emission stage circuit, and a second side of the emission bridge line is connected to a dummy emission stage circuit from among the dummy emission stage circuits.

15. The display device of claim 14, wherein an output terminal of the dummy emission stage circuit is electrically connected to a second pixel corresponding to the one second emission stage circuit.

16. The display device of claim 15, wherein the emission bridge line is configured to transfer an emission control signal of the one second emission stage circuit to a second pixel corresponding to the one second emission stage circuit through the output terminal of the dummy emission stage circuit.

17. The display device of claim 16, wherein the one second emission stage circuit includes at least one transistor and lines connected to the transistor.

18. The display device of claim 17, wherein the emission bridge line is integrally provided with the output terminal of the dummy emission stage circuit.

19. The display device of claim 12, wherein a distance between the second emission stage circuits is larger than a distance between the first emission stage circuits.

20. A display device comprising:
a substrate including first and second display regions and first and second non-display regions;
a plurality of first pixels in the first display region;
a plurality of second pixels in the second display region;
a plurality of first scan stage circuits in the first non-display region, the first scan stage circuits configured to provide a scan signal to the first pixels;
a plurality of first emission stage circuits in the first non-display region, the first emission stage circuits configured to provide an emission control signal to the first pixels;
a plurality of second scan stage circuits in the second non-display region, the second scan stage circuits configured to provide a scan signal to the second pixels;
a plurality of dummy scan stage circuits in the second non-display region, the dummy scan stage circuits being between the second scan stage circuits;
a plurality of second emission stage circuits in the second non-display region, the second emission stage circuits configured to provide an emission control signal to the second pixels;
a plurality of dummy emission stage circuits in the second non-display region, the dummy emission stage circuits being between the second emission stage circuits;
a scan bridge line in the second non-display region, the scan bridge line connecting one second scan stage circuit among the second scan stage circuits and a dummy scan stage circuit adjacent thereto; and
an emission bridge line in the second non-display region, the emission bridge line connecting one second emission stage circuit among the second emission stage circuits and a dummy emission stage circuit adjacent thereto.

* * * * *